United States Patent
Onuki et al.

(10) Patent No.: US 7,684,136 B2
(45) Date of Patent: Mar. 23, 2010

(54) DRIVING SYSTEM AND OPTICAL-ELEMENT DRIVING SYSTEM

(75) Inventors: Ichiro Onuki, Kawasaki (JP); Makoto Sasaki, Ushiku (JP); Keita Misawa, Ushiku (JP); Makoto Mizuno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/208,443

(22) Filed: Sep. 11, 2008

(65) Prior Publication Data

US 2009/0040632 A1    Feb. 12, 2009

Related U.S. Application Data

(62) Division of application No. 11/374,193, filed on Mar. 14, 2006, now Pat. No. 7,460,320.

(30) Foreign Application Priority Data

Mar. 18, 2005    (JP) .............................. 2005-078559

(51) Int. Cl.
  *G02B 7/02* (2006.01)
(52) U.S. Cl. .................................................. 359/823
(58) Field of Classification Search ................ 359/813, 359/814, 823, 824
  See application file for complete search history.

(56) References Cited

U.S. PATENT DOCUMENTS

| 5,313,383 | A | 5/1994 | Ikeuchi ........................ 363/21 |
| 5,822,133 | A | 10/1998 | Mizuno et al. .............. 359/696 |
| 5,927,699 | A | 7/1999 | Nakajima et al. ...... 267/140.14 |
| 6,396,566 | B2 | 5/2002 | Ebinuma et al. .............. 355/53 |
| 6,750,947 | B1 | 6/2004 | Tomita et al. .................. 355/52 |
| 6,930,842 | B2 * | 8/2005 | Shibazaki .................... 359/822 |
| 2002/0163741 | A1 | 11/2002 | Shibazaki .................... 359/819 |
| 2006/0209436 | A1 | 9/2006 | Onuki et al. ................. 359/822 |

FOREIGN PATENT DOCUMENTS

| JP | 4-203629 | 7/1992 |
| JP | 2001-343575 | 12/2001 |
| JP | 2002-131605 | 5/2002 |

* cited by examiner

*Primary Examiner*—Joseph Martinez
(74) *Attorney, Agent, or Firm*—Fitzpatrick, Cella, Harper & Scinto

(57) ABSTRACT

A driving system for driving an optical element in a first direction includes a linear actuator for producing a displacement in a second direction perpendicular to the first direction, a displacement picking unit being extendable in a third direction, perpendicular to both of the first and second directions, for picking out a displacement of the linear actuator, and a direction converting unit disposed at the third-direction side of the linear actuator, for converting a direction of the displacement picked out by the displacement picking unit.

12 Claims, 19 Drawing Sheets

WITH LENS FRAME

WITHOUT LENS FRAME

WITH LENS FRAME

DRIVING SYSTEM AND OPTICAL-ELEMENT DRIVING SYSTEM

This application is a divisional application of copending U.S. patent application Ser. No. 11/374,193, filed Mar. 14, 2006.

This application also claims priority from Japanese Patent Application No. 2005-078559 filed Mar. 18, 2005, which is hereby incorporated by reference.

FIELD OF THE INVENTION AND RELATED ART

This invention relates to a driving system for driving an article to be driven, by use of driving means, such as a laminated piezoelectric actuator, for example.

Semiconductor exposure apparatuses are apparatuses for transferring an original (reticle) having many varieties of different patterns onto a silicon wafer (substrate). In such exposure apparatuses, for the manufacture of a circuit of larger integration, not only must the resolution performance of a projection optical system be improved, but also, the registration (superposition) precision must be improved.

The registration error in semiconductor exposure apparatuses can be categorized into an alignment error, image distortion and a magnification error. The alignment error can be diminished by relative positional adjustment of an original (reticle) and a substrate (wafer). On the other hand, the magnification error is adjustable by moving a portion of a projection optical system in an optical axis direction. When an optical element or elements are going to be moved in the optical axis direction, careful attention should be paid to avoid enlargement of any components other than that in the movement direction, particularly, a parallel deviation and a tilt error. The image distortion is adjustable by intentionally producing parallel deviation or tilt deviation of a portion of the projection optical system.

As regards conventional driving systems for an optical element in a semiconductor exposure apparatus or for ordinary mechanical machines, the following documents are available.

Japanese Laid-Open Patent Application, Publication No. 2001-343575, discloses in FIG. 2 a structure having an outer ring corresponding to a fixed barrel, and an inner ring corresponding to a movable lens frame. The structure illustrated in this drawing comprises three sets of optical element holding devices, corresponding to lens driving systems, which are disposed at positions of relative angles of 120 degrees upon the outer ring. A coupling arm, which is a displacement output portion of the driving system, is connected to the inner ring. By controlling the output displacements of the three sets of driving systems to a desired quantity, the movable lens can be shift-driven in the optical axis direction and, also, it can be tilt-driven about two axes which are orthogonal to the optical axis. FIGS. 11 and 12 of this document illustrate details of the structure of the aforementioned driving system. Specifically, these drawings show a mechanism in which, by use of a piezoelectric actuator (as a drive source) and a flexure mechanism including a rigid linkage and a resilient hinge and having a displacement enlarging and guiding function, the coupling arm portion connected to the movable lens is driven in the optical axis direction of the lens.

Japanese Laid-Open Patent Application, Publication No. 2002-131605, discloses in FIG. 2 a structure for a frame member corresponding to a fixed barrel, and a lens frame member corresponding to a movable lens frame. The structure illustrated in this drawing comprises three sets of flexure mechanisms, corresponding to lens driving systems, which are disposed at the positions of relative angles of 120 degrees upon the frame member. A displacement output portion of each flexure mechanism is connected to a flexure junction that corresponds to a protrusion of the lens frame member. By controlling the output displacements of the three sets of driving systems to a desired quantity, the movable lens can be shift-driven in the optical axis direction and can be shift-driven in two directions orthogonal to the optical axis, and additionally, it can be tilt-driven around two axes which are orthogonal to the optical axis. FIG. 11 of this document illustrates details of the flexure mechanism. Specifically, this drawing shows a mechanism in which pivotal displacement of the displacement output portion of the flexure mechanism is converted into a shift displacement in a horizontal direction and a vertical direction.

Japanese Laid-Open Patent Application, Publication No. 04-203629, discloses a structure for a driving system suitably usable in an anti-vibration system of an engine mount for vehicles. FIG. 20 of this document shows a vibration system in which an actuator that can be elongated and contracted in an axial direction is mounted inside an elliptical ring, and in which the elongation/contraction displacement of the actuator is magnified and direction-converted so as to displace the top surface of the elliptical ring upwardly or downwardly. FIG. 21 of this document shows a vibration system in which an actuator that can be elongated and contracted in an axial direction is mounted inside a pantograph unit, and in which the elongation/contraction displacement of the actuator is magnified and direction-converted so as to displace the top plate of the pantograph upwardly or downwardly.

In the driving system disclosed in Japanese Laid-Open Patent Application, Publication No. 2001-343575, the actuator and the flexure mechanism are disposed in parallel to each other along the optical axis direction of the lens. As a result, the thickness of the outer ring that corresponds to a fixed barrel becomes large.

The driving system disclosed in Japanese Laid-Open Patent Application, Publication No. 2002-131605, is arranged so that the displacement of a free end of a horizontal driving lever and a vertical driving lever is adjusted by means of an adjusting washer and an adjusting button. Hence, it is not structured to automatically control the lens driving displacement. If a piezoelectric actuator, or the like, is used in place of the adjusting washer and the adjusting button described above, an automatically adjustable structure may be provided. On that occasion, however, the actuator would be protruded in the optical axis direction and, as a result, the thickness in the optical axis direction would become large, as in the case of Japanese Laid-Open Patent Application, Publication No. 2001-343575, discussed above.

In the driving system disclosed in Japanese Laid-Open Patent Application, Publication No. 04-203629, the mechanism for magnifying and direction-converting the driving displacement of the actuator is disposed in parallel to the final output displacement direction and, as a result, the size in the final output direction becomes large.

SUMMARY OF THE INVENTION

It is accordingly an object of the present invention to provide a unique and an improved driving system by which at least one of the inconveniences described above can be removed or reduced.

In accordance with an aspect of the present invention, there is provided a driving system for driving an optical element, the driving system comprising:

a linear actuator for producing a displacement in a first direction;

a displacement picking unit being extendable in a second direction, perpendicular to the first direction, for picking out a displacement of the linear actuator; and a direction converting unit disposed at the second-direction side of the linear actuator, for converting the displacement picked out by the displacement picking unit into a third direction, perpendicular to both of the first and second directions.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

FIG. 1A through FIG. 6 are illustrations concerning a driving system according to a first embodiment of the present invention.

Figure 2:
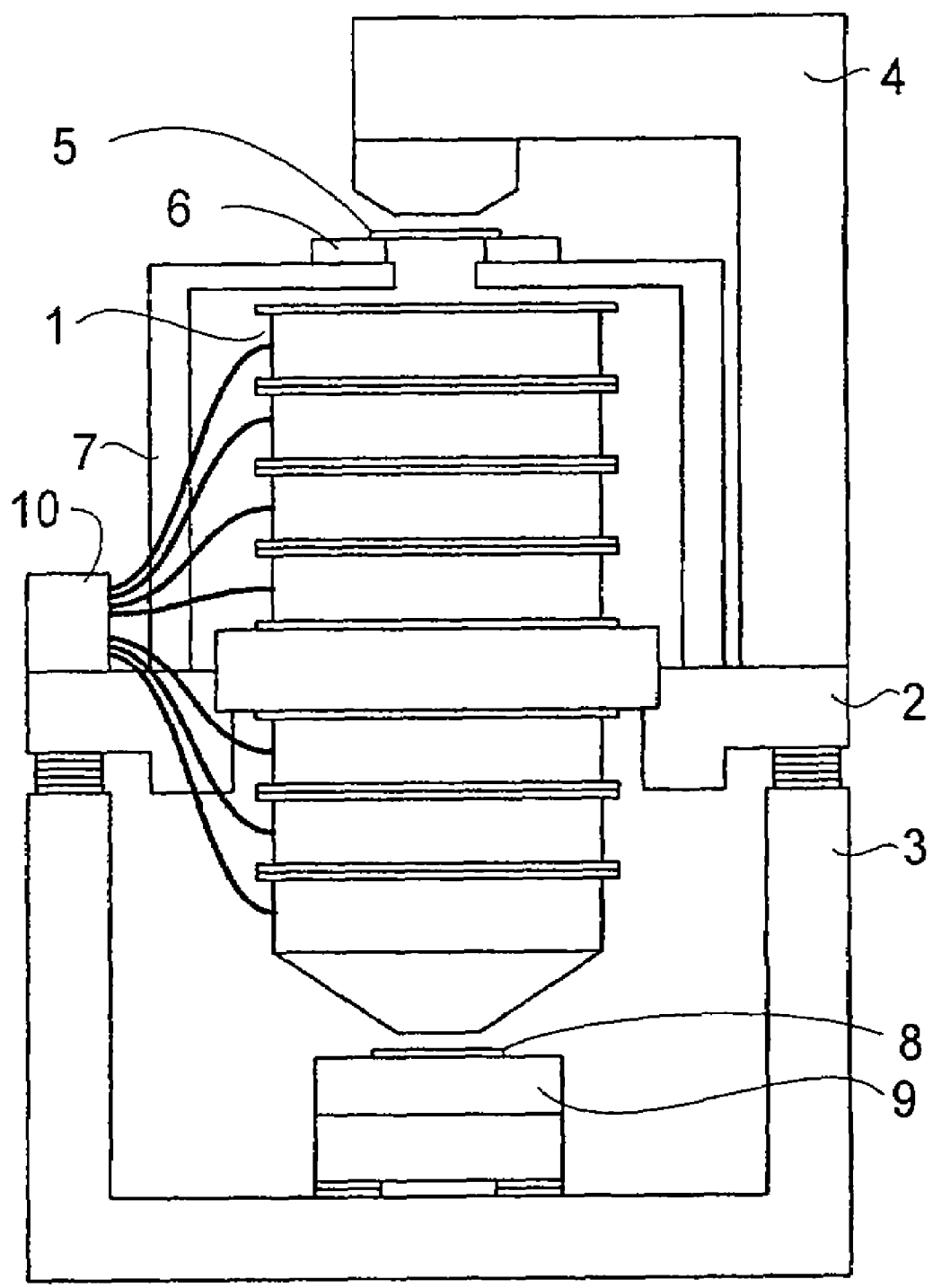
FIG. 2 is a schematic view of a general structure of a semiconductor exposure apparatus into which a driving system according to the present invention is incorporated.

FIG. 2 is a schematic view that shows a general structure of a semiconductor exposure apparatus to which the present invention is applied.

This semiconductor exposure apparatus is a scanner type exposure apparatus in which an exposure operation is carried out by scanningly moving a reticle under slit illumination, while a semiconductor wafer, as well, is scanningly moved in synchronism with the reticle scan motion. In FIG. 2, the exposure apparatus has a projection optical system 1, which is equipped with a driving system of the present invention. More specifically, the projection optical system 1 has a plurality of lens units being accumulated, and each unit comprises a lens having a predetermined optical power, a lens driving system for that lens, and a barrel that accommodates the lens and its lens driving system.

A barrel mount 2 is provided to secure the projection optical system 1 to a main frame 3 of the exposure apparatus. In order to prevent vibration of a ground, where the apparatus is installed, from being transmitted to the projection optical system 1, the main frame 3 and the barrel mount 2 are connected together through an anti-vibration mechanism. An illumination unit 4 is arranged to variably illuminate a reticle 5, which is an original, in various illumination modes. A reticle stage 6 is provided to scanningly move the reticle 5. A reticle support table 7 is provided so as to support the reticle stage 6 upon the barrel mount. A semiconductor wafer 8 is coated with a photosensitive material. A wafer stage 9 holds the semiconductor wafer 8 thereon. By moving the wafer stage 9, the position of the semiconductor wafer 8 with respect to the optical axis direction can be adjusted on one hand, and the semiconductor wafer 8 can be scan-controlled in synchronism with the scan motion of the reticle stage 6 on the other hand.

A lens control unit 10 controls driving systems 110 in accordance with a predetermined control sequence. More specifically, it can operate to adjustably move a predetermined lens in accordance with the result of a calculation made by use of data from various sensors, such as a pressure sensor, for example, and also, in accordance with a program stored beforehand, so as to optimize the optical performance of the projection optical system 1. Details will be described later with reference to FIGS. 6 and 7.

Figure 3A:
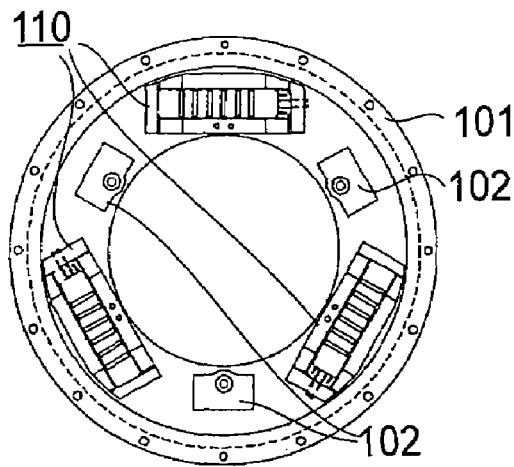
FIGS. 3A, 3B and 3C are schematic views, respectively, for explaining a driving system according to the present invention as the same is applied to a lens driving system.
Figure 3B:
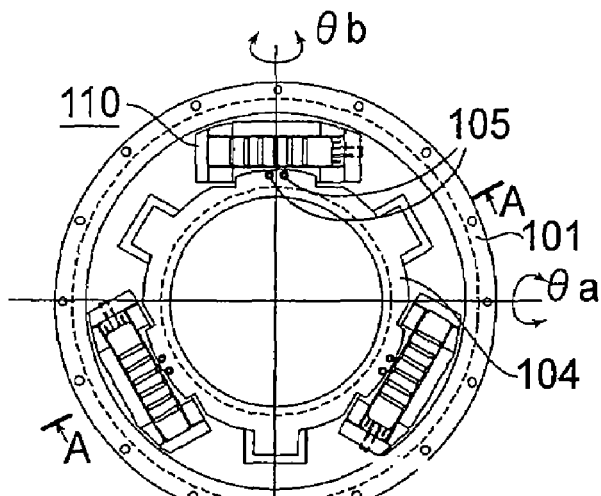
Figure 3C:
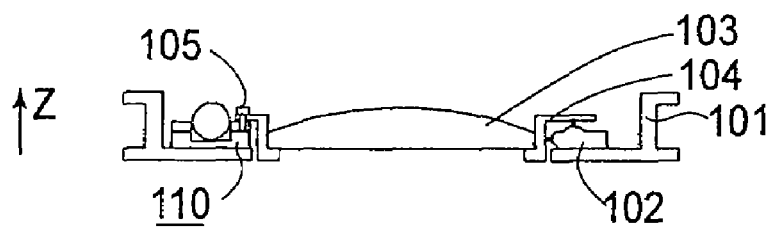

FIGS. 3A, 3B and 3C illustrate an optical element driving system having a plurality of driving systems 110 for moving a lens 103 in a desired direction. More particularly, FIG. 3A is a plan view showing the structure where a lens and a lens frame are demounted, and FIG. 3B is a plan view of the structure where the lens and the lens frame are mounted. FIG. 3C is a sectional view.

In FIGS. 3A and 3C, a fixed barrel 101 has a flat portion where driving means and lens position detecting means according to the present invention (to be described later) should be fixed, and a cylindrical side wall portion to be joined to upper and lower adjacent lens units.

As regards the driving systems 110, three sets of identical driving systems are mounted on the bottom flat portion of the barrel 101. Lens position detecting means 102 is operable to detect any displacement of a lens frame 104 with respect to the optical axis direction (Z direction), as well as any displacement thereof with respect to a radial direction thereof being perpendicular to the optical axis. An interferometric gauge using a semiconductor wafer may be conveniently used for the same.

FIG. 3B shows the structure where the lens 103 and the lens frame 104 are mounted. The lens frame 104 that accommodates the lens 103 is provided with flange-shaped protrusions at six locations upon the top surface thereof. The flanges at three protrusions of the six protrusions are connected to displacement output portions of the driving systems 110 by means of lens frame connecting screws 105. The remaining three flanges will be used as a target for detection of any lens frame displacement.

The lens position detecting means 102 is arranged to project detection laser beams in the optical axis direction of the lens 103, as well as in the radial direction of the same and, on the basis of interference between reflected light and reference light, it detects any displacement of three portions of the lens frame 104 (adjacent to its three flanges), with respect to the optical axis direction and the radial direction.

With the structure described above, by driving the three sets of driving systems 110 by the same amount, the lens 103 can be moved translationally in the optical axis direction. On the other hand, if these three sets of driving systems are driven by different driving amounts, the lens can be tilt-driven in a θa direction and a θb direction shown in FIG. 3B. In this case, the output of the position detecting means 102 in relation to the optical axis direction may be fed back, by which the translational driving amount of the lens 103, as well as the tilt driving amount thereof, can be controlled very accurately. Furthermore, the output of the position detecting means 102 in relation to the radial direction may be monitored and, on that occasion, the amount of image shift due to parallel deviation along a plane orthogonal to the optical axis of the lens 103 can be calculated. The calculation result may be added to the driving amount of the wafer stage 9 shown in FIG. 2, by which any alignment error of the reticle image due to a lens eccentricity can be reduced.

Figure 1A:
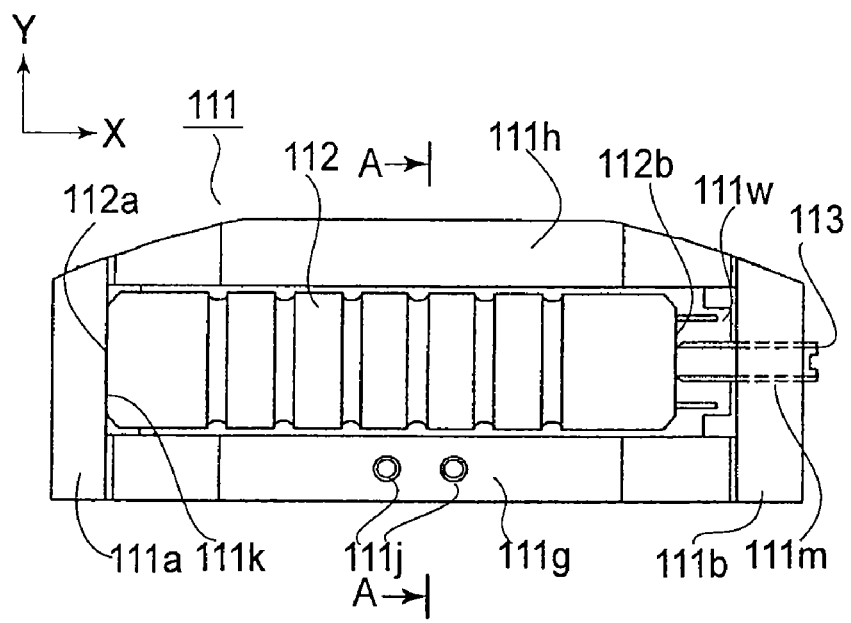
FIGS. 1A, 1B and 1C are schematic views, respectively, for explaining the structure of a driving system according to a first embodiment of the present invention.
Figure 1B:
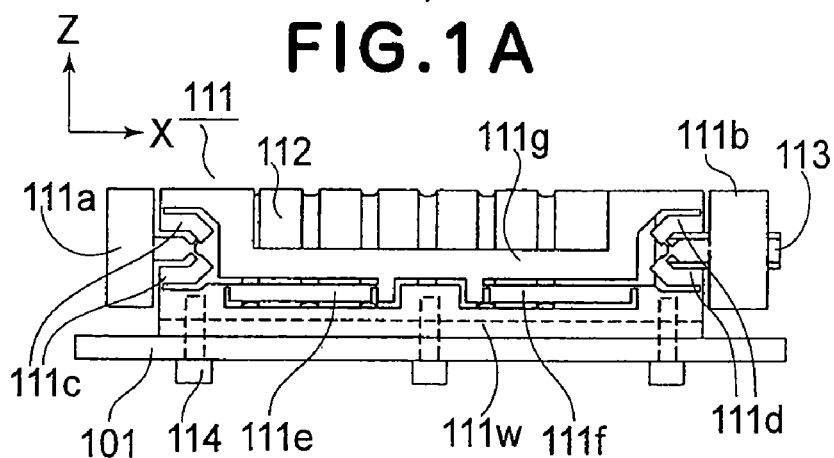
Figure 1C:
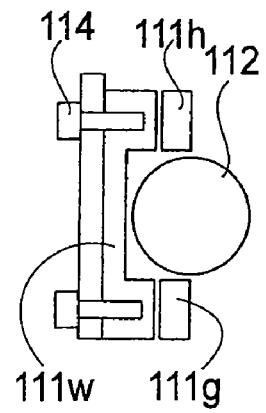

FIGS. 1A, 1B and 1C illustrate details of one driving system 110 shown in FIG. 2. More particularly, FIG. 1A is a plan view of it as seen from above, along the optical axis direction of the lens. The X and Y axes are defined as depicted there. FIG. 1B is a side view of it as the same is seen from the lens center. The X and Z axes are defined as depicted there. FIG. 1C is a sectional view, taken on a line A-A in FIG. 1A.

In FIGS. 1A-1C, the mechanism comprises a fixed barrel 101, a driving mechanism main assembly 111, a piezoelectric actuator 112 having piezoelectric output ends 112a and 112b, a piezoelectric actuator adjusting screw 113, and mount screws 114. The driving mechanism main assembly 111 includes displacement pick-out linkages 111a and 111b, direction converting linkages 111c and 111d, supporting linkages 111e and 111f, a lens frame driving linkage 111g, a counter linkage 111h, lens frame mount screw bores 111j, a piezoelectric actuator abutment 111k, a piezoelectric actuator adjusting screw bore 111m, bottom notches 111p, and a bottom 111w.

In FIGS. 1A-1C, the barrel 101 has a flat portion formed at the top thereof. The driving system main assembly 111 has a linkage mechanism having been made from a single metal block in accordance with a wire electrical discharge machining process and a cutting process. The piezoelectric actuator 112 of a lamination type includes a driving source having alternately layered electrostrictive elements and electrodes, which driving source is sealingly housed in a closed type cylindrical container. The whole length of the piezoelectric actuator 112 with respect to the X-axis direction is expandable approximately in proportion to an applied voltage thereto. The piezoelectric actuator adjusting screw 113 is provided to correct any dimensional error of the actuator 112, and it is interposed between the driving system main assembly 111 and the actuator 112. The mount screws 114 serve to fixedly connect the driving system main assembly 111 to the barrel 101.

Figure 4A:
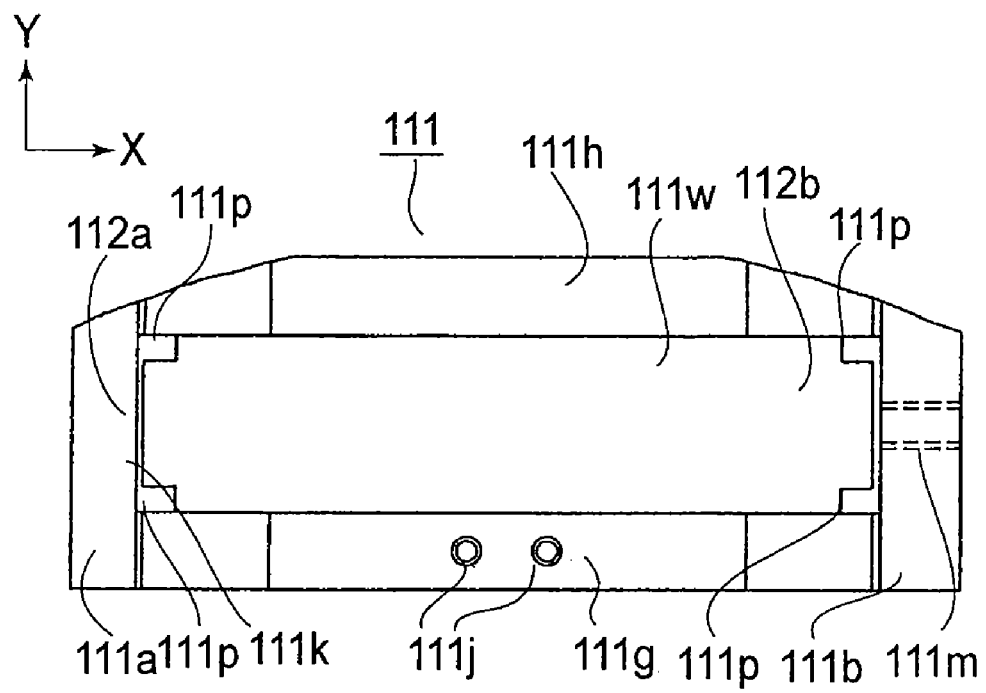
FIGS. 4A and 4B are schematic views, respectively, for explaining details of the structure of the driving system according to the first embodiment of the present invention.
Figure 4B:
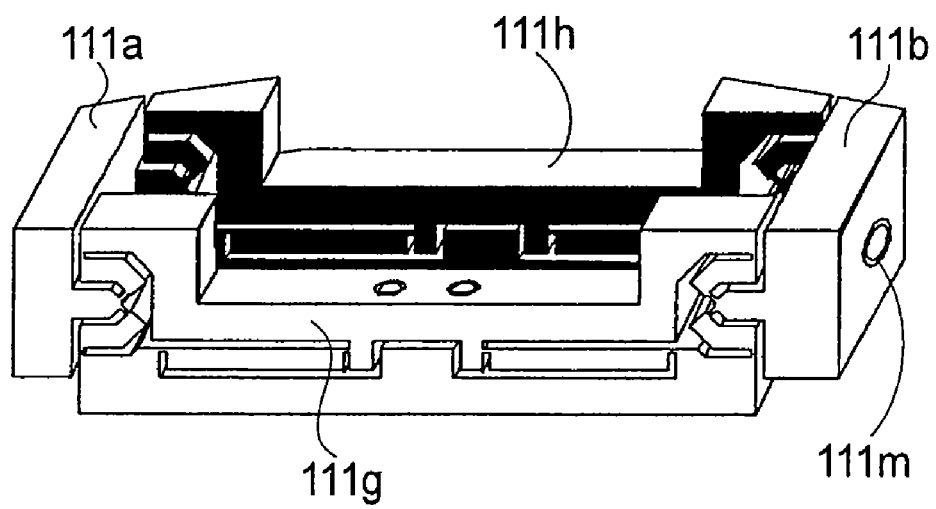

FIGS. 4A and 4B show details of the linkage mechanism, wherein the piezoelectric actuator 112 and the piezoelectric actuator adjusting screw 113 are demounted from the driving system main assembly 111. Here, FIG. 4A is a plan view, and FIG. 4B is a perspective view. Referring to FIGS. 1A-1C and FIGS. 4A and 4B, the manner how to make the driving system main assembly 111 will be explained below.

First of all, from a metal block, which is a base material, by milling, the outermost configuration surface of the linkage mechanism is produced. Furthermore, by milling, the surface of the bottom 111w of the mechanism shown in FIG. 4A is formed. In order to remove corner portions of the bottom plate 111w, bottom notches 111p are formed by a wire electrical discharge machining process.

Subsequently, by wire electrical discharge machining, a slit shown in FIG. 1B is formed. By forming this slit, the linkage structure is produced. This linkage structure includes displacement pick-out linkages 111a and 111b, direction converting linkages 111c and 111d, supporting linkages 111e and 111f, a lens frame driving linkage 111g, and a counter linkage 111h. These linkages are connected together by resilient hinge means. Finally, by using a drilling machine, bores for lens frame mounting screw bores 111j, piezoelectric actuator adjusting screw bore 111m, and bottom screw bores for fixation to the lens barrel are machined and then they are threaded. By this, the linkage mechanism is accomplished. With the procedure described above, the linkage mechanism of the driving system main assembly 111 can be produced out of a single metal block.

Figure 5A:
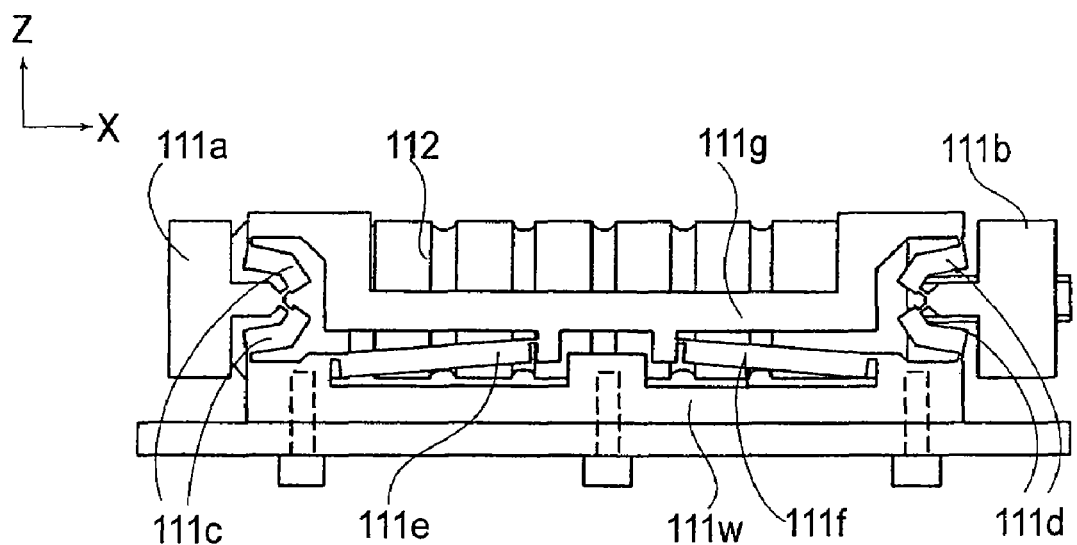
FIGS. 5A and 5B are schematic views, respectively, for explaining the operation of the driving system according to the first embodiment of the present invention.
Figure 5B:
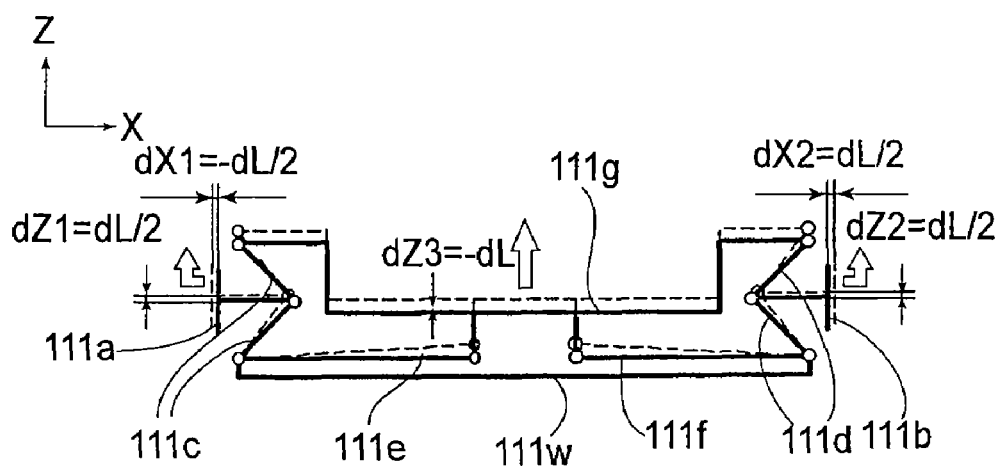

FIGS. 5A and 5B are illustrations for explaining the linkage operation of the driving system main assembly 111. Here, FIG. 5A is a side view of the linkage mechanism as the piezoelectric actuator 112 is in its expanded position. FIG. 5B is a diagrammatic view of the linkage mechanism.

Referring to FIGS. 1A-1C and FIGS. 5A and 5B, the assembling procedure of the driving system main assembly 111, as well as the driving principle of the same will be explained.

First of all, in FIG. 1A, the piezoelectric actuator 112 is put into an inside central space of the driving system main assembly 111. After this, the piezoelectric actuator adjusting screw 113 is screwed into the piezoelectric actuator adjusting screw bore 111m from the right-hand side thereof, to push the bottom 112b of the piezoelectric actuator 112 leftwardly, until the output end 112a of the piezoelectric actuator 112 abuts against the right-hand end face of the displacement pick-out linkage 111a of the linkage mechanism. Then, the mounting of piezoelectric actuator 112 is completed.

If a predetermined voltage is applied to two electrode terminals, which are provided at the bottom of the right-hand side end portion of the piezoelectric actuator 112, in response, the whole length L of the piezoelectric actuator 112 expands by dL in the X direction.

At this time, as shown in FIG. 5B, one (111a) of the displacement pick-out linkages shifts leftwardly by −dL/2, while the other displacement pick-out linkage 111b shifts rightwardly by dL/2.

As the piezoelectric actuator displaces, the converting linkages 111c and 111d are pivotally moved. Furthermore, the displacement pick-out linkages 111a and 111b are moved upwardly in the Z-axis direction by about dL/2, in addition to the displacement in the X-axis direction. The direction converting linkage comprises a pantograph structure having linkage elements tilted by about 45 degrees with respect to the X axis. The lens frame driving linkage 111g, which is connected to the direction converting linkage is moved upwardly by about dL along the Z-axis direction. Therefore, the lens frame 104 (not shown), which is connected to the lens frame mounting screw bores 111j formed at the top face of the lens frame driving linkage 111g is similarly moved upwardly by about dL along the optical axis direction (Z direction).

Although the lens frame driving linkage 111g displaces in the optical axis direction in response to the extension of the piezoelectric actuator 112 as described above, it is desired that the lens frame driving linkage 111g can displace only in the optical axis direction and it is not displaceable in the X and Y directions.

In order to accomplish such structural features, an auxiliary linkage to be described below may be added. First of all, in order to restrict movement of the lens frame driving linkage 111g in the X direction, supporting linkages 111e and 111f are connected to the lower portion of the lens frame driving linkage. By means of these supporting linkages 111e and 111f, it is assured that the lens frame driving linkage 111g has a displacement freedom with respect to the optical axis direction, whereas the freedom in the X direction is restricted. Hence, it is displaceable only in the optical axis direction.

On the other hand, in order to restrict movement of the lens frame driving linkage 111g in the Y direction, a counter linkage 111h, such as shown in FIG. 1A, may be provided. Although the planar shape of the counter linkage 111h as seen from above is slightly different from the lens frame driving linkage 111g, the linkage structure as seen from the side thereof has exactly the same shape as that of the lens frame driving linkage 111g and those linkages connected thereto. More specifically, in FIG. 1A, the piezoelectric actuator 112 is disposed at the middle, between two sets of direction converging linkages (pantograph linkage means), having approximately the same structure. On the other hand, these two sets of linkages are connected to the displacement pick-out linkages 111a and 111b, which extend in the Y direction.

As a result of this, in response to expansion of the piezoelectric actuator 112, the lens frame driving linkage 111g and the counter linkage 111h displace by the same amount in the Z direction, yet they provide a structure having high shearing rigidity with respect to the Y direction. Since the region around the lens frame mounting screw bores 111j is displaceable only in the Z direction, the freedom thereof with respect to the X and Y directions are restricted. Therefore, the lens frame 104 (not shown in theses drawings) can be driven in the Z direction very accurately.

Furthermore, although the displacement pick-out linkages 111a and 111b are movable translationally in the X direction and also in the optical axis direction, there occurs no rotational motion about the X axis, Y axis or optical axis (Z axis). As a result, no deflection stress is applied to the piezoelectric actuator 112, and, thus, breakage of the piezoelectric actuator 112, which is a fragile member, can be prevented effectively.

Figure 6:
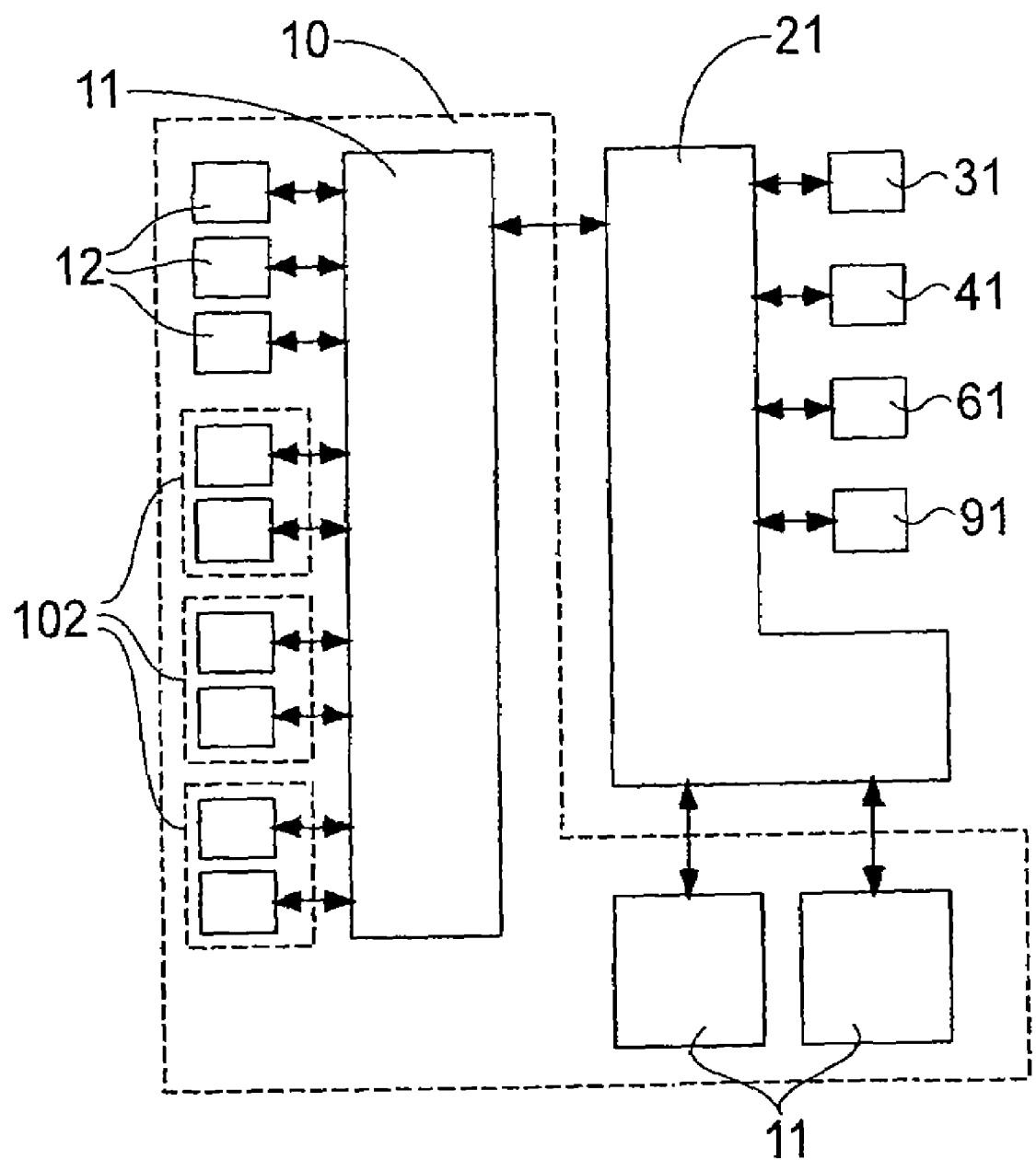
FIG. 6 is a block diagram of a control system in an optical element driving system according to the present invention.

FIG. 6 is a block diagram of a control system for controlling the exposure operation and the lens driving operation, and so on, in the semiconductor exposure apparatus shown in FIG. 2. More specifically, in FIG. 6, a main CPU 21 controls operations of the exposure apparatus as a whole. Mount controlling means 31 controls anti-vibration operations of the barrel mount 2. Illumination controlling means 41 controls the illumination mode of the illumination unit and the light quantity thereof. Reticle stage controlling means 61 controls driving operations for the reticle stage 6. Wafer stage controlling means controls driving operations for the wafer stage 9.

Lens controlling means 10 includes a plurality of lens CPUs 11, each lens CPU being configured to control driving operations for an associated one of the lenses, such as shown in FIGS. 3A-3C. To each lens CPU 11, three piezoelectric drivers 12 are connected. Each of these piezoelectric drivers 12 is arranged to drive an associated one of the piezoelectric actuators 112, which are stored in the three sets of driving systems 110 shown in FIGS. 3A-3C. On the other hand, to each lens CPU 11, six lens position detecting means 102 are connected. Each of these lens position detecting means 102 corresponds to the lens position detecting means 102 having been described with reference to FIGS. 3A-3C.

Three lens position detecting means of these six lens position detecting means 102 are arranged to detect any displacement of the lens frame 104 with respect to the optical axis direction. The remaining three lens position detecting means 102 are arranged to detect any displacement of the lens frame 104 with respect to the radial direction thereof. As regards the remaining CPUs, piezoelectric drivers 12 and lens position detecting means 102 are similarly connected to the same.

Figure 7:
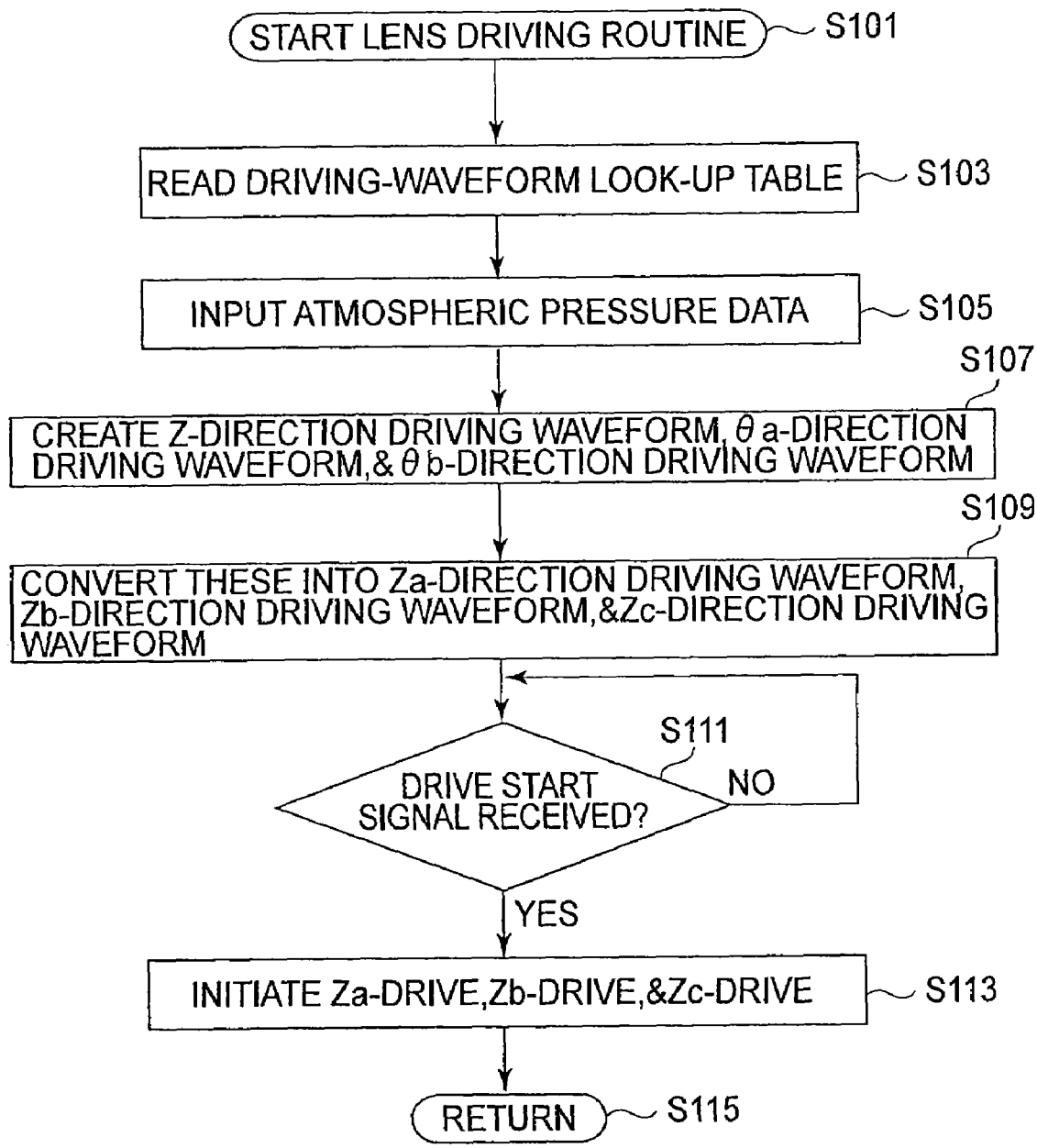
FIG. 7 is a flowchart for explaining a control sequence in an optical element driving system according to the present invention.

FIG. 7 is a flow chart for explaining the control sequence of these lens CPUs 11.

At step S101, in response to communication with the main CPU 21, execution of the lens driving routine is initiated.

At step S103, a lookup table concerning the driving waveform for the lens, which is going to be driven, is read out by means of the main CPU 21. The lookup table contains various correction parameters, such as, for example, correction quantities for the lens driving position related to the illumination modes, driving waveforms for correcting, in real time, various aberrations to be produced in reticle images due to reticle scanning motion, and correction quantities for correcting any changes in optical characteristics of the lens due to heat generation to be caused by absorption of illumination light by the lens.

At step S105, the pressure of an ambient gas that surrounds the lens is detected on the basis of an output from a pressure sensor, not shown, and a lens position correcting quantity for compensating for a change in the refractive index is calculated.

At step S107, on the basis of the data obtained at the steps S103 and S105, the translational driving waveform for the lens 103 in the optical axis direction, as well as the tilt driving waveforms for the same with respect to the θa direction and the θb direction, are generated.

At step S109, these three lens driving waveforms produced at the step S107 are converted into optical-axis-direction driving waveforms Za, Zb and Zc for the three sets of driving systems 110, as shown in FIGS. 3A-3C.

At step S111, communication with the main CPU 21 is taken, and then supply of a lens drive starting command is awaited.

Unless a lens drive starting signal is received, the sequence is stood by at step S111. As a lens drive starting command is received, the sequence goes to step S113.

At step S113, in order to drivingly control the three sets of driving systems 110 in accordance with the driving waveforms produced at step S109, the piezoelectric drivers 12 are drivingly controlled while monitoring the outputs of the lens position detecting means 102.

At step S115, one lens-driving operation is completed, and the sequence returns.

With the execution of the sequential procedure described above, the lens 103 shown in FIGS. 3A-3C can be drivingly controlled in accordance with desired waveforms. Similar controls may, of course, be carried out with regard to the remaining lenses, by which the imaging performance of the whole optical system of the projection optical lens 1 shown in FIG. 2 can be optimized. Therefore, the image of the reticle 1 can be projected onto the wafer 8 very precisely.

Although, in this embodiment, a lamination type piezoelectric actuator is used as a drive source, a linear actuator having a combination of a motor and a ball screw may be used.

As described above, the driving system according to this embodiment of the present invention may include (i) driving means for producing a drive displacement in the X direction, (ii) displacement pick-out means extending in the Y direction to pick out the displacement in terms of the Y direction, and (iii) direction converting means for converting the direction of the thus picked displacement into the Z direction. The driving means 112 may produce a drive displacement in the X direction on the basis of a change in the whole length thereof or a shift of the displacement output portion thereof. The direction converting means may be disposed in the Y direction, relative to the driving means. Additionally, the direction converting means may have an approximately symmetrical shape with respect to the X direction. Furthermore, the direction converting means may be provided by two sets of linkage mechanisms having approximately the same shape. These two sets of linkage mechanisms may be disposed at opposite sides of the driving means 112. The displacement pick-out means may be made movable approximately translationally along the X direction. The displacement pick-out means and the direction converting means may be made substantially from a single piece of material.

In accordance with the first embodiment described hereinbefore, the following advantageous results are obtainable.

1.1 Use of driving means, such as a laminated piezoelectric actuator extending in the Y direction and a linkage mechanism provided in the X direction orthogonal to the Y direction and having a function for converting an output displacement of the actuator produced in the Y direction into a displacement in the Z direction, which is orthogonal to the X and Y directions, enables provision of a small-thickness driving system with the size thereof in the Z direction being decreased.

1.2 Since the linkage mechanism has a shape, which is an approximately symmetrical shape in the first direction, any unwanted displacement in the Y direction can be made very small.

1.3 Two sets of linkage mechanisms having approximately the same shape are disposed at the opposite sides of the actuator with respect to the X direction. With this arrangement, inside stresses in the X direction produced within the linkage mechanisms are balanced, such that any unwanted displacement in the X direction can be made very small.

1.4 The displacement pick-out linkage, which is in abutment with the actuator is movable only translationally, and it does not produce pivotal displacement. As a result, no deflection stress in the bend direction is produced in the actuator and, thus, breakage of the actuator can be avoided.

1.5 Since the linkage mechanism having a rigid linkage and a resilient hinge can be made from a single block-like base material, any decrease of dimensional precision and a decrease of rigidity due to the coupling of plural components can be avoided. Furthermore, the assembling operation becomes easier, and, in addition to this, it is very convenient in regard to a reduction in size.

1.6 A plurality of driving systems are disposed around an optical element. This ensures accurate drive of the optical element in a desired direction while, on the other hand, it enables a reduction in size of the optical element driving system, as a whole, including an optical element and driving systems therefor, particularly, in the thickness with respect to the optical axis direction of the optical element. As a result of this, each of plural optical elements adjoining to each other can be equipped with such a driving system. This leads to enlargement of the degree of adjustment freedom of the whole optical system and it contributes to improvements of the optical performance. Furthermore, since the apparatus mechanism as a whole can be made small in size, the installment area as well as the cost can be reduced conveniently.

Embodiment 2

In the driving system of the first embodiment described hereinbefore, the linkage mechanism of the driving system main assembly 111 has a structure being approximately symmetrical with respect to the X-axis direction. As compared with this, in a driving system according to a second embodiment of the present invention to be described below, the shape in the X direction is made asymmetric. This is to simplify the structure and also to improve the rigidity in the X-axis direction.

Figure 8A:
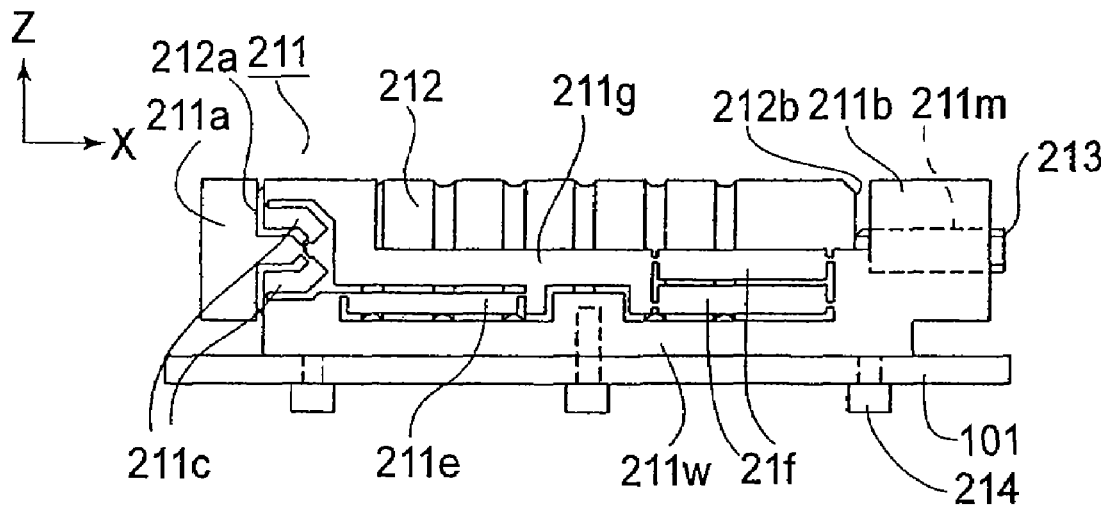
FIGS. 8A and 8B are schematic views, respectively, for explaining the structure and operation of a driving system according to a second embodiment of the present invention.
Figure 8B:
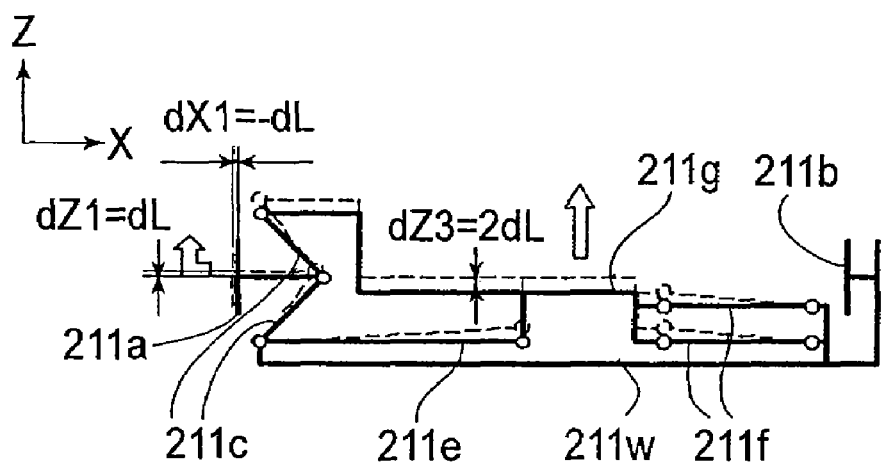

FIG. 8A is a side view of a driving system main assembly according to the second embodiment of the present invention, and FIG. 8B is a schematic view for explaining the operation of the linkage mechanism.

In FIGS. 8A and 8B, the mechanism comprises a fixed barrel 101, a driving mechanism main assembly 211, a piezoelectric actuator 212 having piezoelectric output ends 212a and 212b, a piezoelectric actuator adjusting screw 213, and mount screws 214. The driving mechanism main assembly 211 includes a displacement pick-out linkage 211a, a piezoelectric actuator fixing portion 211b, a direction converting linkage 211c, supporting linkages 211e and 211f, a lens frame 515i and a driving linkage 211g therefor, a counter linkage 211h, lens frame mount screw bores 211j, a piezoelectric actuator abutment 211k, an adjusting screw bore 211m, bottom notches 211p, and a bottom 211w.

In FIG. 8A, the lens barrel 101 has a flat portion. The driving system main assembly 211 has a linkage mechanism having been made from a single metal block in accordance with a wire electrical discharge machining process and a cutting process. The piezoelectric actuator 212 of a lamination type has the same structure as that of the piezoelectric actuator 112 of the first embodiment, and it includes a driving source having alternately layered electrostrictive elements and electrodes, which driving source is sealingly housed in a closed type cylindrical container. The whole length of the piezoelectric actuator with respect to the X-axis direction is expandable approximately in proportion to an applied voltage thereto.

The piezoelectric actuator adjusting screw 213 is provided to correct any dimensional error of the actuator 212, and it is interposed between the driving system main assembly 211 and the actuator 212. The mount screws 214 serve to fixedly connect the driving system main assembly 211 to the barrel 101.

Although illustration of a plan view of this driving system main assembly 211 will be omitted here, like the driving system 110 of the first embodiment, a linkage mechanism is disposed in front of the piezoelectric actuator 212 and, additionally, another linkage mechanism having the same sectional shape as that of the first-mentioned linkage mechanism is disposed at the opposite side of the actuator 212.

The driving system main assembly 211 can be made in a similar manner as the driving system main assembly 111 of the first embodiment. A description thereof will be omitted here for this reason.

Referring to FIG. 8A, the assembling procedure of the driving system will be explained.

First of all, the piezoelectric actuator 212 is put into an inside central space of the driving system main assembly 211. After this, the piezoelectric actuator adjusting screw 213 is screwed into the piezoelectric actuator adjusting screw bore 211*m*, formed in the piezoelectric actuator fixing portion 211*b*, from the right-hand side thereof, to push the bottom 212*b* of the piezoelectric actuator 212 leftwardly, until the output end 212*a* of the piezoelectric actuator 212 abuts against the right-hand end face of the displacement pick-out linkage 211*a* of the linkage mechanism. Then, the mounting of piezoelectric actuator 212 is completed.

If a predetermined voltage is applied to two electrode terminals, which are provided at the bottom of the right-hand side end portion of the piezoelectric actuator 212, in response, the whole length L of the piezoelectric actuator 212 expands by dL in the X direction. Referring now to FIG. 8B, the operation of the linkage mechanism will be explained.

The piezoelectric actuator fixing portion 211*b* provided at the right-hand side end of the driving system main assembly 211 is a rigid material portion being continuous from the bottom 211*w*. Therefore, if the whole length L of the piezoelectric actuator 212 expands by dL in the X direction, since the piezoelectric actuator fixing portion is immovable, only the displacement pick-out linkage 211*a* at the left-hand end displaces leftwardly by −dL.

As the piezoelectric actuator 212 is driven, the direction converting linkage 211*c* is moved pivotally, and the displacement pick-out linkage 211*a* is moved upwardly in the Z direction by about dL, in addition to the displacement in the X-axis direction. The direction converting linkage 211*c* comprises a pantograph structure having linkage elements tilted by about 45 degrees with respect to the X axis. The lens frame driving linkage 211*g* is moved upwardly by about 2 dL along the Z-axis direction. Therefore, the lens frame 104 (not shown), which is connected to the lens frame mounting screw bores formed at the top face of the lens frame driving linkage 211*g*, is similarly moved upwardly by about 2 dL along the Z direction.

Although the lens frame driving linkage 211*g* displaces in the Z direction in response to the extension of the piezoelectric actuator 212, as described above, it is desired that the lens frame driving linkage 211*g* can displace only in the Z direction and it is not displaceable in the X and Y directions.

In order to accomplish such structural features, an auxiliary linkage to be described below may be added.

First of all, in order to restrict movement of the lens frame driving linkage 211*g* in the X direction, supporting linkages 211*e* and 211*f* are connected to the lower portion and the right-hand end portion of the lens frame driving linkage, respectively. Since the right-hand end supporting linkage 211*f* provides a parallel linkage mechanism, it is assured that the lens frame driving linkage 211*g* has a displacement freedom with respect to the Z direction, whereas the freedom in the X direction is restricted. In addition, any rotational motion about the Y axis is restricted.

On the other hand, in order to restrict movement of the lens frame driving linkage 211*g* in the Y direction, as has been described with reference to FIG. 8A, a counter linkage 111*h* (not shown in this drawing) having the same sectional shape as that of the lens frame driving linkage 211*g*, is provided at the side of the piezoelectric actuator 212 opposite to the linkage 211*g*.

In these two sets of linkage mechanisms, the left-hand side thereof is connected to the displacement pick-out linkage 211*a* extending in the Y-axis direction, while the right-hand side thereof is connected to the piezoelectric actuator fixing portion 211*b*.

As a result of this, in response to expansion of the piezoelectric actuator 212, the lens frame driving linkage 211*g* and the counter linkage 211*h* displace by the same amount in the Z direction, yet they provide a structure having high shearing rigidity with respect to the Y direction. Since the region around the lens frame mounting screw bores 211*j* is displaceable only in the Z direction, the freedom thereof with respect to the X and Y directions are restricted. Therefore, the lens frame 104 can be driven in the Z direction very accurately.

Although the displacement pick-out linkages 211*a* and 211*b* are movable translationally in the X-axis direction and also in the Z-axis direction, since the right-hand end 212*b* of the piezoelectric actuator is held fixed, to be exact, the displacement pick-out linkage 211*a* is displaceable about the Y axis by a small amount. However, since the amount is very small, any deflection stress produced in the piezoelectric actuator 212 is minute. Thus, breakage of the piezoelectric actuator 212, which is a fragile member, can be prevented effectively.

The driving system 211 of the second embodiment may be replaced by the driving system 110 of FIGS. 3A-3C, and the control block diagram, as well as the control sequence having been described with reference to FIGS. 6 and 7, may be used. On that occasion, similar functions as those of the first embodiment will be provided.

As described above, the driving system according to the second embodiment of the present invention may include (i) driving means for producing a drive displacement in the X direction, (ii) displacement pick-out means extending in the Y direction, orthogonal to the X direction, to pick out the displacement, and (iii) direction converting means for converting the displacement picked out by the displacement pick-out means into a displacement in the Z direction (optical axis direction), which is orthogonal to both of the X and Y directions. The driving means may produce a drive displacement in the X direction on the basis of a change in the whole length thereof or a shift of the displacement output portion thereof. The direction converting means may be disposed in the Y direction, relative to the driving means. Additionally, in this driving system, the direction converting means may have an asymmetrical shape with respect to the X direction, and an end of the driving means may be substantially fixed to the fixed portion of the driving system. Also, the direction converting means may be disposed at an opposite side of the fixed portion of the driving means with respect to the X direction. Furthermore, in the driving system of the second embodiment, the direction converting means may be provided by two sets of linkage mechanisms having approximately the same shape. These two sets of linkage mechanisms may be disposed at opposite sides of the driving means. On the other hand, in the driving system of the second embodiment, the displacement pick-out means may be made movable approximately translationally along the X direction. Furthermore, in the driving system of the second embodiment, the displacement pick-out means and the direction converting means may be made substantially from a single piece of material.

In accordance with the second embodiment of the present invention described hereinbefore, the following advantageous results are obtainable.

2.1 Use of driving means, such as a laminated piezoelectric actuator extending in the X direction and a linkage mechanism provided in the Y direction orthogonal to the X direction and having a function for converting an output displacement of the actuator produced in the X direction into a displacement in the Z direction, which is orthogonal to the X and Y directions, enables provision of a small-thickness driving system with the size thereof in the Z direction being decreased.

2.2 Since an end of the actuator is connected to a fixed portion, the rigidity of the linkage mechanism in the X direction can be made high. As a result, any resonance due to transmission of unwanted outside vibration can be reduced effectively.

2.3 Two sets of linkage mechanisms having approximately the same shape are disposed at the opposite sides of the actuator with respect to the Y direction. With this arrangement, inside stresses in the Y direction produced within the linkage mechanisms are balanced, such that any unwanted displacement in the Y direction can be made very small.

2.4 The displacement pick-out linkage, which is in abutment with the actuator, is movable only translationally, and it does not produce pivotal displacement. As a result, no deflection stress in the bend direction is produced in the actuator and, thus, breakage of the actuator can be avoided.

2.5 Since the linkage mechanism having a rigid linkage and a resilient hinge can be made from a single block-like base material, any decrease of dimensional precision and a decrease of rigidity due to the coupling of plural components can be avoided. Furthermore, the assembling operation becomes easier, and, in addition to this, it is very convenient in regard to a reduction in size.

2.6 A plurality of driving systems are disposed around an optical element. This ensures accurate drive of the optical element in a desired direction while, on the other hand, it enables reduction in size of the optical element driving system, as a whole, including an optical element and driving systems therefor, particularly, in the thickness with respect to the optical axis direction of the optical element. As a result of this, each of plural optical elements adjoining to each other can be equipped with such a driving system. This leads to enlargement of the degree of adjustment freedom of the whole optical system and it contributes to improvements of the optical performance. Furthermore, since the apparatus mechanism as a whole can be made small in size, the installment area, as well as the cost, can be reduced conveniently.

Embodiment 3

In the driving systems according to the first and second embodiments described hereinbefore, a direction converting linkage (pantograph type linkage) having an angle of about 45 degrees with respect to the output displacement direction of the actuator is used to convert the direction of the output displacement. As compared therewith, in a third embodiment of the present invention to be described blow, a lever type linkage having an L shape is used to achieve both a reduction of thickness and prevention of unwanted displacement.

FIGS. 9A and 9B through FIGS. 11A and 11B are illustrations concerning the third embodiment of the present invention.

Figure 9A:
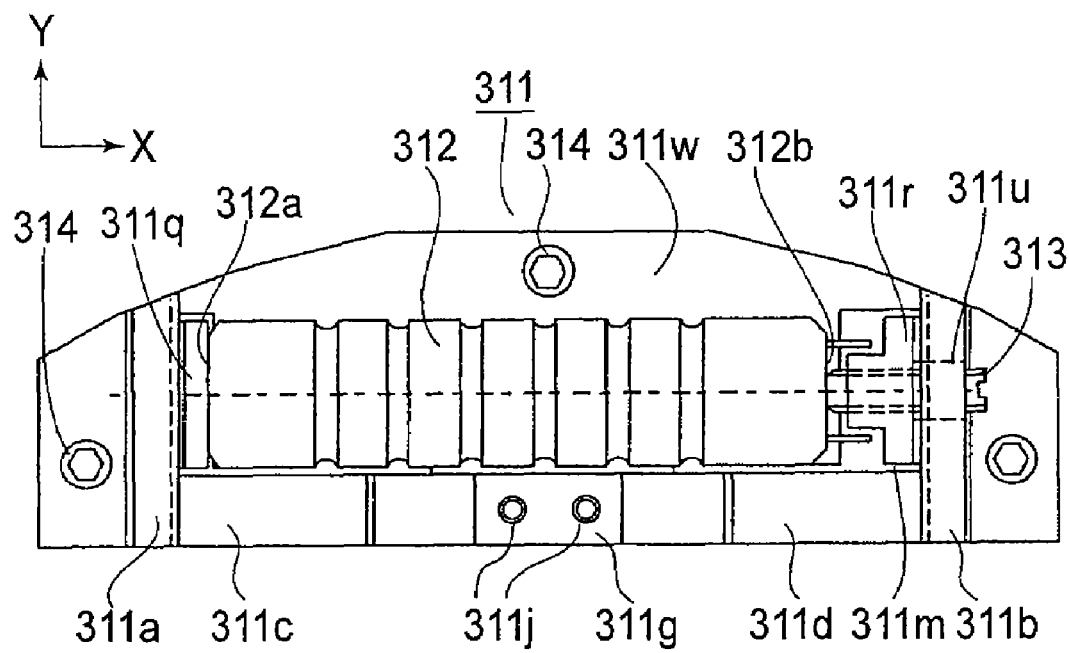
FIGS. 9A and 9B are schematic views, respectively, for explaining the structure of a driving system according to a third embodiment of the present invention.
Figure 9B:
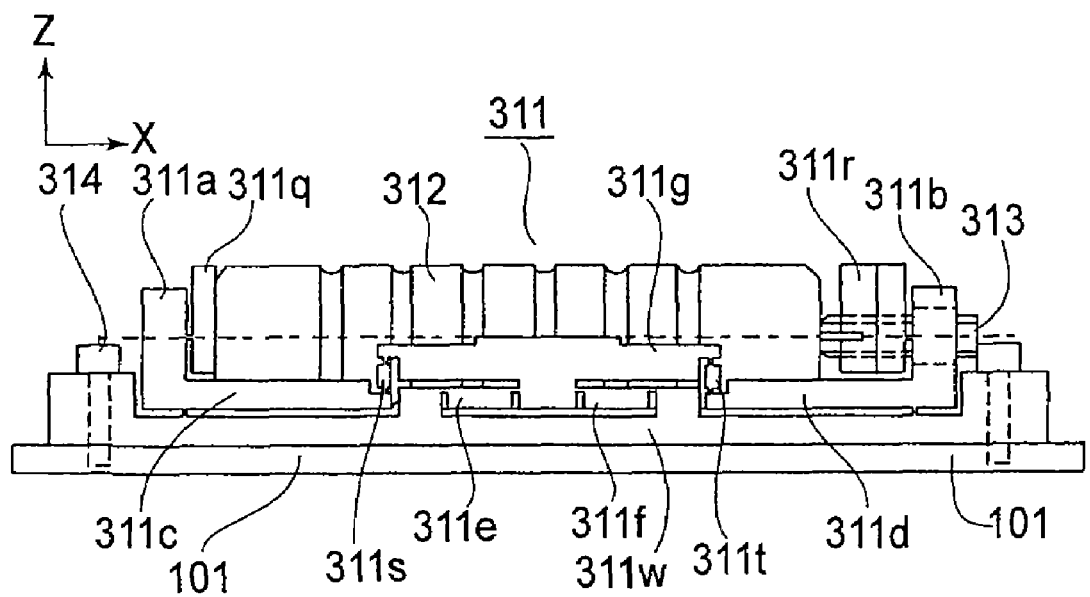

Specifically, FIGS. 9A and 9B illustrate details of the driving system of the third embodiment, wherein FIG. 9A is a plan view of it as the same is seen from above along the optical axis direction of the lens, and FIG. 9B is a side view of the same as seen from the lens center. The X axis, Y axis and Z axis are defined as illustrated, similarly to the first embodiment.

In FIGS. 9A and 9B, the mechanism comprises a fixed barrel 101, a driving mechanism main assembly 311, a piezoelectric actuator 312 having piezoelectric output ends 312a and 312b, a piezoelectric actuator adjusting screw 313, and driving mechanism mount screws 314. The driving mechanism main assembly 311 includes displacement pick-out linkages 311a and 311b, direction converting linkages 311c and 311d, supporting linkages 311e and 311f, a lens frame driving linkage 311g therefor, lens frame mount screw bores 311j, a piezoelectric actuator abutment 311k, an adjusting screw bore 311m, bottom notches 311p, piezoelectric actuator end linkages 311q and 311r, straight-motion converting linkages 311s and 311t, an adjusting screw clearance bore 311u, and a bottom 311w.

The barrel 101 has a flat portion, such as shown in FIG. 3A-3C. The driving system main assembly 311 has a linkage mechanism having been made from a single metal block in accordance with a wire electrical discharge machining process and a cutting process. The piezoelectric actuator 312 of a lamination type has a similar structure as that of the piezoelectric actuator 112 of the first embodiment, and it includes a driving source having alternately layered electrostrictive elements and electrodes, which driving source is sealingly housed in a closed type cylindrical container. The whole length of the piezoelectric actuator 312 with respect to the X-axis direction is expandable approximately in proportion to an applied voltage thereto. The piezoelectric actuator adjusting screw 313 is provided to correct any dimensional error of the actuator 312, and it is interposed between the driving system main assembly 311 and the actuator 312. The mount screws 314 serve to fixedly connect the driving system main assembly 311 to the barrel 101.

Figure 10A:
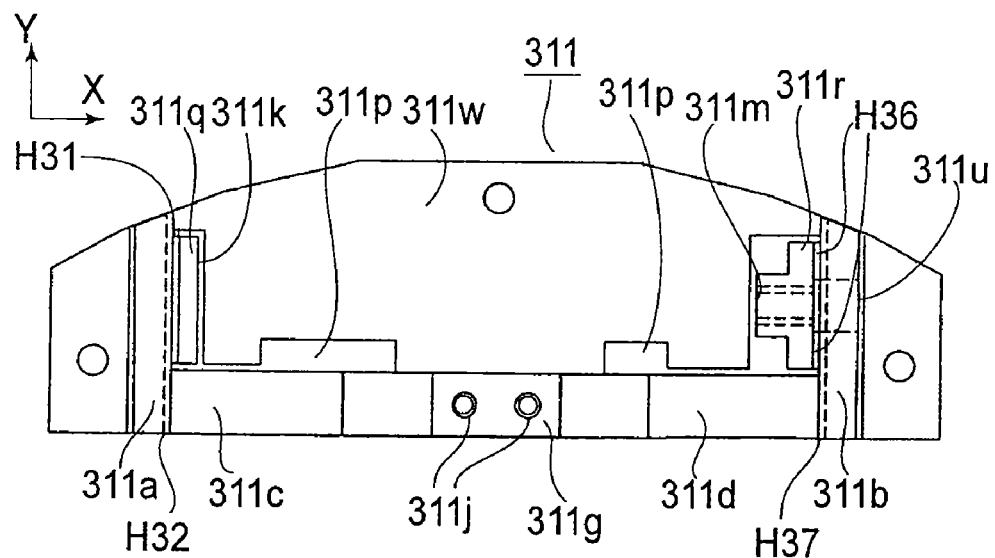
FIGS. 10A and 10B are schematic views, respectively, for explaining details of the structure of the driving system according to the third embodiment of the present invention.
Figure 10B:
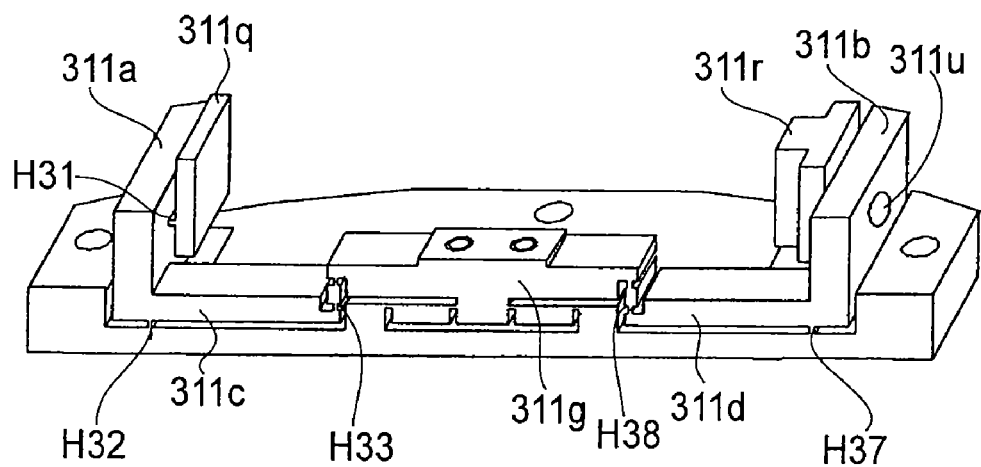

FIGS. 10A and 10B show details of the linkage mechanism wherein the piezoelectric actuator 312 and the piezoelectric actuator adjusting screw 313 are demounted from the driving system main assembly 311. Here, FIG. 10A is a plan view, and FIG. 10B is a perspective view.

Referring to FIGS. 9A and 9B and FIGS. 10A and 10B, the manner of how to make the driving system main assembly 311 will be explained below.

First of all, from a metal block, which is a base material, by milling, the outermost configuration surface of the linkage mechanism is produced. Furthermore, by milling, the surface of the bottom 311w of the mechanism shown in FIG. 10A is formed.

Then, in order to remove corner portions of the bottom plate 311w, bottom notches 311p are formed by a wire electrical discharge machining process.

Subsequently, by wire electrical discharge machining, a slit shown in FIG. 9B is formed. By forming this slit, the linkage structure is produced. This linkage structure includes displacement pick-out linkages 311a and 311b, direction converting linkages 311c and 311d, supporting linkages 311e and 311f, a lens frame driving linkage 311g, lens frame mounting screw bores 311j, a piezoelectric actuator abutment 311k, a piezoelectric actuator adjusting screw bore 311m, bottom bores 311p, piezoelectric actuator end linkages 311q and 311r, and straight-motion converting linkages 311s and 311t. These linkages are connected together by resilient hinge means.

Finally, by using a drilling machine, bores for lens frame mounting screw bores 311j, piezoelectric actuator adjusting screw bore 311m, and three bores for connection with the fixed barrel are machined and then they are threaded. By this, the linkage mechanism is accomplished. With the procedure described above, the linkage mechanism of the driving system main assembly 311 can be produced out of a single metal block.

Figure 11A:
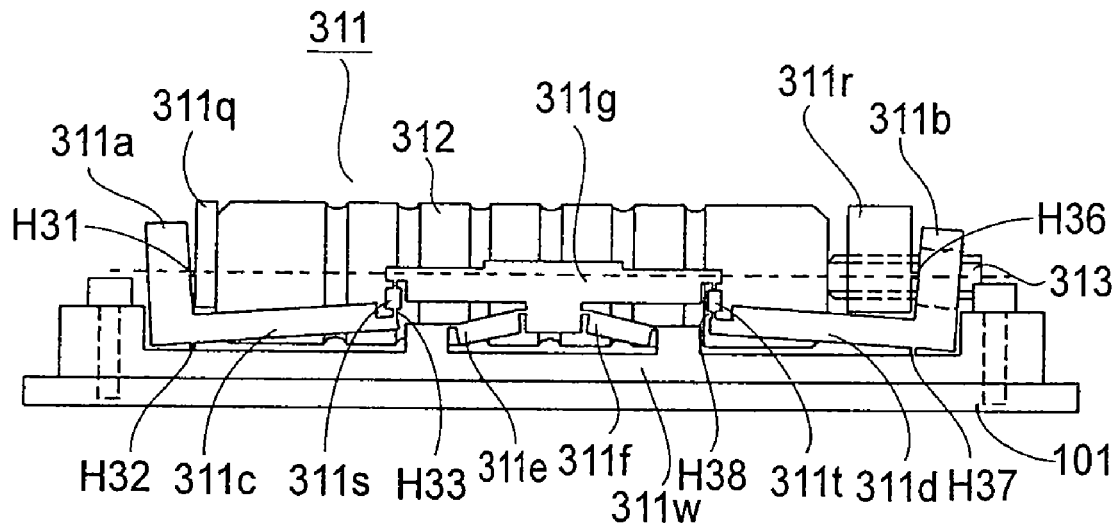
FIGS. 11A and 11B are schematic views, respectively, for explaining the operation of the driving system according to the third embodiment of the present invention.
Figure 11B:
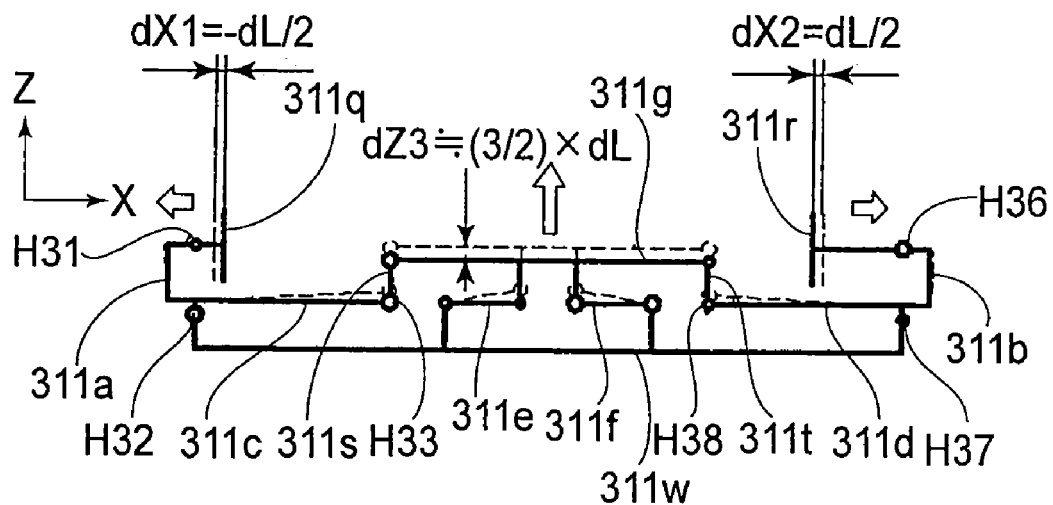

FIGS. 11A and 11B are illustrations for explaining the linkage mechanism of the driving system main assembly 311. Here, FIG. 11A is a side view of the linkage mechanism as the piezoelectric actuator 312 is in its expanded position. FIG. 11B is a diagrammatic view of the linkage mechanism.

Referring to FIGS. 9A and 9B and FIGS. 11A and 11B, the assembling procedure of the driving system main assembly 311, as well as the operational principle of the same will be explained.

First of all, in FIG. 9A, the piezoelectric actuator 312 is put into an inside central space of the driving system main assembly 311. After this, the piezoelectric actuator adjusting screw 313 is screwed into the piezoelectric actuator adjusting screw bore 311m from the right-hand side thereof, to push the bottom 312b of the piezoelectric actuator 312 leftwardly, until the output end 312a of the piezoelectric actuator 312 abuts against the right-hand end face of the piezoelectric actuator end linkage 311q of the linkage mechanism.

Then, the mounting of piezoelectric actuator 312 is completed.

If a predetermined voltage is applied to two electrode terminals, which are provided at the bottom of the right-hand side end portion of the piezoelectric actuator 312, in response, the whole length L of the piezoelectric actuator 312 expands by dL in the X direction.

As a result of this, as shown in FIG. 11B, one (311q) of the piezoelectric actuator end linkages shifts leftwardly by −dL/2, while the other piezoelectric actuator end linkage 311r shifts rightwardly by dL/2. These displacements are transmitted to the displacement pick-out linkages 311a and 311b connected by way of resilient hinges H31 and H36, respectively. Here, the displacement pick-out linkage 311a, which extends in the Y direction, is a portion of an L-shaped linkage that is formed integrally with the displacement converting linkage 311c, extending rightwardly in the X direction. This L-shaped linkage is pivotally movable about a resilient hinge H32, that is, about the Y axis. In addition, the right-hand side end of it is connected to the straight-motion converting linkage 311s through a resilient hinge H33.

Similarly, the displacement pick-out linkage 311b, which extends in the Y direction is a portion of an L-shaped linkage that is formed integrally with the displacement converting linkage 311d, extending leftwardly in the X direction. This L-shaped linkage is pivotally movable about a resilient hinge H37, that is, about the Y axis. In addition, the left-hand side end of it is connected to the straight-motion converting linkage 311t through a resilient hinge H38.

In the structure described above, a displacement dX1 of the piezoelectric actuator end linkage 311q in the X direction is converted into a Z-axis direction displacement dZ3 of the straight-motion converting linkage 311s, through a pivotal motion of the L-shaped linkage. Here, the displacement magnification that corresponds to the ratio of dZ3 to dX1 is equal to the ratio between the interspace of the hinges H36 and H37 and the interspace of the hinges H37 and H38.

In the third embodiment of the present invention, the linkage lengths and hinge positions are so set that this displacement magnification becomes approximately equal to three.

Similarly, the linkages 311r, 311b and 311d and the hinges H36, H37 and H38 at the right-hand side are structured to be symmetrical with respect to the left-hand side linkage mechanism described above.

In summary, an expansion displacement dL of the piezoelectric actuator 312 is distributed into a displacement −dL/2 of the piezoelectric actuator end linkage 311q and a displacement dL/2 of the piezoelectric actuator end linkage 311r; then, direction conversion and displacement magnification are carried out to them by means of the L-shaped linkage; and finally, they are converted into a Z-direction displacement (3/2)×dL of the lens frame driving linkage 311g.

Although the lens frame driving linkage 311g displaces in the Z direction in response to the extension of the piezoelectric actuator 312, as described above, it is preferable that the lens frame driving linkage 311g can displace only in the Z direction, and it is not displaceable in the X and Y directions.

In order to accomplish such structural features, an auxiliary linkage to be described below may be added. First of all, in order to restrict movement of the lens frame driving linkage 311g in the X direction, supporting linkages 311e and 311f are connected to the lower portion of the lens frame driving linkage 311g. Y By means of these supporting linkages 311e and 311f, it is assured that the lens frame driving linkage 311g has a displacement freedom with respect to the Z direction, whereas the freedom in the X direction is restricted. Hence, it is displaceable only in the Z direction.

On the other hand, in order to prevent torsion of the pivotal axis of the displacement conversion linkages, the support linkages 311e and 311f are arranged so that the lengths in the pivotal axis direction of the resilient hinges H32 and H37, each defining a pivot axis, are made long.

This will be explained in detail with reference to FIGS. 10A and 10B. The hinge H32, which has been made by a wire electrical discharge machining process at the bottom face of the displacement pick-out linkage 311a that extends in the Y direction, is formed with a largest size, as much as possible, with respect to the Y-axis direction of the driving system main assembly 311.

With this structure, the torsional rigidity about the Z axis of the direction converting linkage 311c can be made high, such that unwanted displacement in the Y direction of the connection H33 thereof with the straight-motion linkage 311s can be avoided effectively. The right-hand side hinge H37 has a similar structure.

With the arrangement described above, expansion displacement of the piezoelectric actuator 312 is magnified by a predetermined ratio and the direction thereof is converted, and it causes a displacement of the lens frame driving linkage 311g in the Z-axis direction.

Here, since unwanted displacement in the X and Y directions is restricted, the lens frame (not shown in these drawings) is driven precisely only in the Z direction.

Furthermore, the displacement magnifying ratio for the piezoelectric actuator 312 can be easily set at a desired quantity by appropriately setting the interspace between the hinges H31 and H33 and the interspace between the hinges H37 and H38.

The driving system 311 of the third embodiment may be replaced by the driving system 110 of FIGS. 3A-3C, and the control block diagram, as well as the control sequence having been described with reference to FIGS. 6 and 7, may be used. On that occasion, similar functions as those of the first embodiment will be provided.

As described above, the driving system according to the third embodiment of the present invention may include (i) driving means for producing a drive displacement in the X direction, on the basis of a change in the whole length thereof or a motion of a displacement output portion thereof, (ii) displacement pick-out means extending in the Y direction, orthogonal to the X direction, to pick out the displacement, and (iii) direction converting means for converting the displacement picked out by the displacement pick-out means into a displacement in the Z direction, which is orthogonal to both of the X and Y directions. The direction converting means may be disposed in the Y direction, relative to the driving means.

Additionally, the direction converting means may have an approximately symmetrical shape with respect to the X direction, and the displacement pick-out means may be pivotally movable about the Y axis. Furthermore, the displacement pick-out means and the direction converting means may be made substantially from a single piece of material.

In accordance with the third embodiment of the present invention described hereinbefore, the following advantageous results are obtainable.

3.1 Use of driving means, such as a laminated piezoelectric actuator extending in the X direction and a linkage mechanism provided in the Y direction orthogonal to the X direction and having a function for converting an output displacement of the actuator produced in the X direction into a displacement in the Z direction, which is orthogonal to the X and Y directions, enables provision of a small-thickness driving system with the size thereof in the Z direction being decreased.

3.2 Since the linkage mechanism has an approximately symmetrical shape with respect to the X direction, unwanted displacement in the X direction can be made quite small.

3.3 A counter linkage for preventing unwanted displacement is omitted and, thus, further reduction in size is possible. Furthermore, since there is no load resistance of the counter linkage, a drive displacement of equal amount is obtainable even by use of a lower-output actuator.

3.4 The displacement pick-out linkage and the direction converting linkage have a large freedom in the linkage length setting. Therefore, the displacement magnifying ratio of the piezoelectric actuator can be set at a desired quantity very easily.

3.5 Since the linkage mechanism having a rigid linkage and a resilient hinge can be made from a single block-like base material, any decrease of dimensional precision and a decrease of rigidity due to the coupling of plural components can be avoided. Furthermore, the assembling operation becomes easier, and, in addition to this, it is very convenient in regard to a reduction in size.

3.6 A plurality of driving systems are disposed around an optical element. This ensures accurate drive of the optical element in a desired direction while, on the other hand, it enables a reduction in size of the optical element driving system, as a whole, including an optical element and driving systems therefor, particularly, in the thickness with respect to the optical axis direction of the optical element. As a result of this, each of plural optical elements adjoining to each other can be equipped with such a driving system. This leads to enlargement of the degree of adjustment freedom of the whole optical system and it contributes to improvements of the optical performance. Furthermore, since the apparatus mechanism as a whole can be made small in size, the installment area, as well as the cost can be reduced conveniently.

Embodiment 4

In the driving system of the third embodiment described hereinbefore, the linkage mechanism of the driving system main assembly 311 has a structure being approximately symmetrical with respect to the X-axis direction. As compared with this, in a driving system according to a fourth embodiment of the present invention to be described below, the shape in the X direction is made asymmetric, as in the second embodiment described earlier. This is to simplify the structure.

Figure 12A:
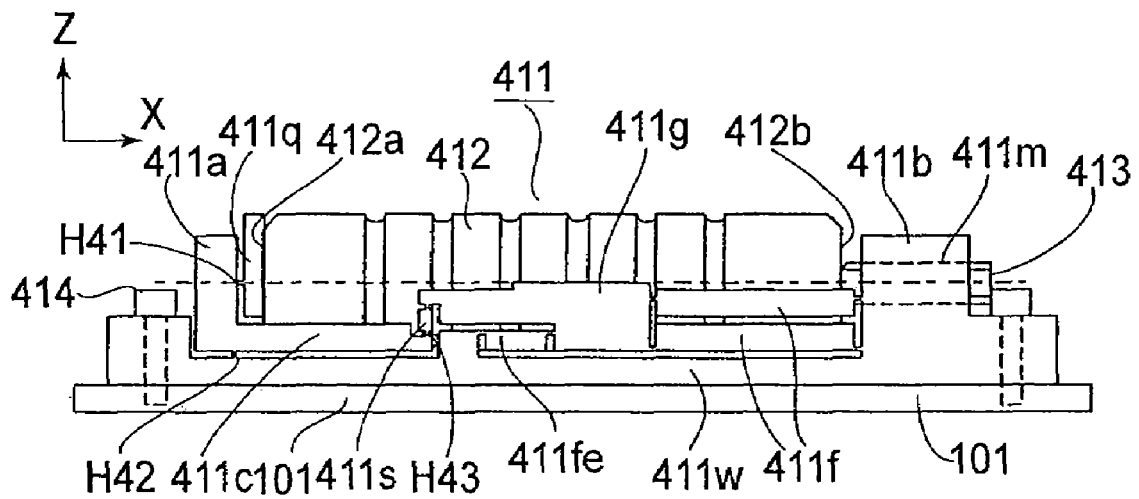
FIGS. 12A and 12B are schematic views, respectively, for explaining the structure and operation of a driving system according to a fourth embodiment of the present invention.
Figure 12B:
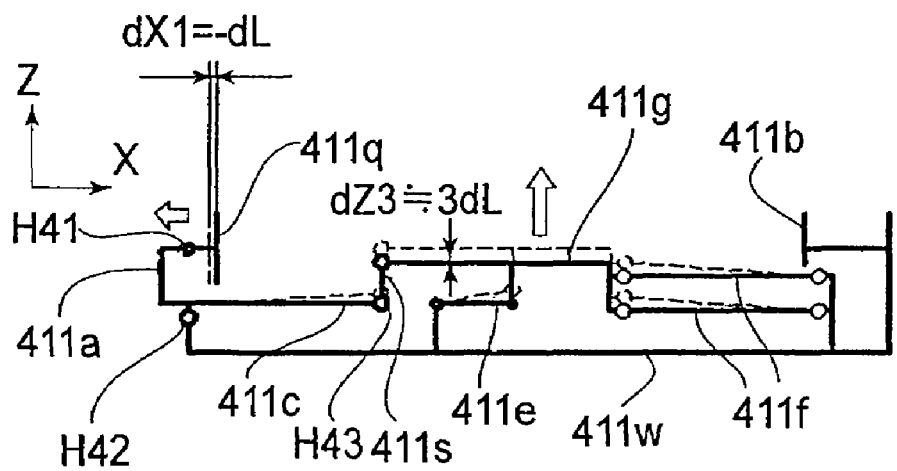

FIG. 12A is a side view of a driving system main assembly according to the fourth embodiment of the present invention, and FIG. 12B is a schematic view for explaining the operation of the linkage mechanism.

In FIGS. 12A and 12B, the mechanism comprises a fixed barrel 101, a driving mechanism main assembly 411, a piezoelectric actuator 412 having piezoelectric output ends 412a and 412b, a piezoelectric actuator adjusting screw 413, and mount screws 414. The driving mechanism main assembly 411 includes a displacement pick-out linkage 411a, a piezoelectric actuator fixing portion 411b, a direction converting linkage 411c, supporting linkages 411e and 411f, a lens frame driving linkage 411g, lens frame mount screw bores 411j, a piezoelectric actuator abutment 411k, an adjusting screw bore 411m, bottom notches 411p, a piezoelectric actuator end linkage 411q, a straight-motion converting linkage 411s, and a bottom 411w.

In FIG. 12A, the lens barrel 101 has a flat portion. The driving system main assembly 411 has a linkage mechanism having been made from a single metal block in accordance with a wire electrical discharge machining process and a cutting process. The piezoelectric actuator 412 of a lamination type has the same structure as that of the piezoelectric actuator 112 of the first embodiment, and it includes a driving source having alternately layered electrostrictive elements and electrodes, which driving source is sealingly housed in a closed type cylindrical container. The whole length of the piezoelectric actuator with respect to the X-axis direction is expandable approximately in proportion to an applied voltage thereto. The piezoelectric actuator adjusting screw 413 is provided to correct any dimensional error of the actuator 412, and it is interposed between the driving system main assembly 411 and the actuator 412.

The mount screws 414 serve to fixedly connect the driving system main assembly 411 to the barrel 101.

Although illustration of a plan view of this driving system main assembly 411 will be omitted here, as in the driving system of the third embodiment, there is only the linkage mechanism disposed in front of the piezoelectric actuator 412.

The driving system main assembly 411 can be made in a similar manner as the driving system main assembly 111 of the first embodiment. A description thereof will be omitted here for this reason.

Referring to FIG. 12A, the assembling procedure of the driving system will be explained.

First of all, the piezoelectric actuator 412 is put into an inside central space of the driving system main assembly 411. After this, the piezoelectric actuator adjusting screw 413 is screwed into the piezoelectric actuator adjusting screw bore 411m, formed in the piezoelectric actuator fixing portion 211b, from the right-hand side thereof to push the bottom 412b of the piezoelectric actuator 412 leftwardly, until the output end 412a of the piezoelectric actuator 412 abuts against the right-hand end face of the displacement pick-out linkage 411a of the linkage mechanism. Then, the mounting of piezoelectric actuator 412 is completed.

If a predetermined voltage is applied to two electrode terminals, which are provided at the bottom of the right-hand side end portion of the piezoelectric actuator 412, in response, the whole length L of the piezoelectric actuator 412 expands by dL in the X direction.

Referring now to FIG. 12B, the operation of the linkage mechanism will be explained.

The piezoelectric actuator fixing portion 411b provided at the right-hand side end of the driving system main assembly 411 is a rigid material portion being continuous from the bottom 411w. Therefore, if the whole length L of the piezoelectric actuator 412 expands by dL in the X direction, since the piezoelectric actuator fixing portion is immovable, only the displacement pick-out linkage 411a at the left-hand end displaces leftwardly by dX1=−dL.

As a result of this, an L-shaped direction converting linkage provided by an integral structure of the displacement pick-out linkage 411a and the direction converting linkage 411c pivotally rotates about a resilient hinge H42, which in turn causes upward movement of the straight motion converting linkage 411s in the Z-axis direction by an amount of dZ3.

The ratio of dZ to dX1 at this moment is determined by the interspaces of the three hinges, similarly, in accordance with the principle described with reference to the third embodiment.

In the fourth embodiment, as well, the displacement magnifying ratio is set to about three.

In response to the expansion displacement dL of the piezoelectric actuator 412, the lens frame driving linkage 411g is moved upwardly by about 3 dL along the Z-axis direction. Therefore, the lens frame 104 (not shown), which is connected to the lens frame mounting screw bores 411 (not shown in these drawings), formed at the top face of the lens frame driving linkage 411g, is similarly moved upwardly by about 3 dL along the Z direction.

Although the lens frame driving linkage 411g displaces in the Z direction in response to the extension of the piezoelectric actuator 412, as described above, it is desired that the lens frame driving linkage 411g can displace only in the Z direction and it is not displaceable in the X and Y directions.

In order to accomplish such structural features, as in the third embodiment, an auxiliary linkage to be described below may be added.

First of all, in order to restrict movement of the lens frame driving linkage 411g in the X direction, supporting linkages 411e and 411f are connected to the lower portion and the right-hand end portion of the lens frame driving linkage 411g, respectively.

Here, since the right-hand end supporting linkage 411f provides a parallel linkage mechanism, it is assured that the lens frame driving linkage 411g has a displacement freedom with respect to the Z direction, whereas the freedom in the X direction is restricted. In addition, any rotational motion about the Y axis is restricted.

Furthermore, as in the third embodiment, due to the support linkage 411f, the displacement pick-out linkage 411a extends in the Y direction and, therefore, the length of the resilient hinge H42, which defines the pivot center of the L-shaped direction converting linkage, becomes large. As a result of this, unwanted torsion of the L-shaped direction converting linkage about the Z axis is avoided.

This assures that the region around the lens frame mounting screw bores 411j, provided in the lens frame driving linkage 411g, is displaceable only in the Z direction, and the freedom thereof with respect to the X and Y directions is restricted. Therefore, the lens frame 104 can be driven in the Z direction very accurately.

The driving system 411 of the fourth embodiment may be replaced by the driving system 110 of FIGS. 3A-3C, and the control block diagram, as well as the control sequence having been described with reference to FIGS. 6 and 7, may be used. On that occasion, similar functions as those of the first embodiment will be provided.

As described above, the driving system according to the fourth embodiment of the present invention may include (i) driving means for producing a drive displacement in the X direction on the basis of a change in the whole length thereof or a motion of a displacement output portion thereof, (ii) displacement pick-out means extending in the Y direction, orthogonal to the X direction, to pick out the displacement, and (iii) direction converting means for converting the displacement picked out by the displacement pick-out means into a displacement in the Z direction, which is orthogonal to both of the X and Y directions. The direction converting means may be disposed in the Y direction, relative to the driving means.

In addition to this, the direction converting means may have an asymmetrical shape with respect to the X direction, and an end of the driving means may be substantially fixed to the fixed portion of the driving system. Also, the direction converting means may be disposed at an opposite side of the fixed portion of the driving means with respect to the X direction. Furthermore, the displacement pick-out means may be made pivotally movable about the Y axis. On the other hand, the displacement pick-out means and the direction converting means may be made substantially from a single piece of material.

In accordance with the fourth embodiment of the present invention described hereinbefore, the following advantageous results are obtainable.

4.1 Use of driving means, such as a laminated piezoelectric actuator extending in the X direction and a linkage mechanism provided in the Y direction orthogonal to the X direction and having a function for converting an output displacement of the actuator produced in the X direction into a displacement in the Z direction, which is orthogonal to the X and Y directions, enables provision of a small-thickness driving system with the size thereof in the Z direction being decreased.

4.2 Since an end of the actuator is connected to a fixed portion, the rigidity of the linkage mechanism in the Y direction can be made high. As a result, any resonance due to transmission of unwanted outside vibration can be reduced effectively.

4.3 A counter linkage for preventing unwanted displacement is omitted and, thus, further reduction in size is possible. Furthermore, since there is no load resistance of the counter linkage, a drive displacement of an equal amount is obtainable even by use of a lower-output actuator.

4.4 The displacement pick-out linkage and the direction converting linkage have a large freedom in the linkage length setting. Therefore, the displacement magnifying ratio of the piezoelectric actuator can be set at a desired quantity very easily.

4.5 Since the linkage mechanism having a rigid linkage and a resilient hinge can be made from a single block-like base material, any decrease of dimensional precision and a decrease of rigidity due to the coupling of plural components can be avoided. Furthermore, the assembling operation becomes easier, and, in addition to this, it is very convenient in regard to a reduction in size.

4.6 A plurality of driving systems are disposed around an optical element. This ensures accurate drive of the optical element in a desired direction while, on the other hand, it enables a reduction in size of the optical element driving system, as a whole, including an optical element and driving systems therefor, particularly, in the thickness with respect to the optical axis direction of the optical element. As a result of this, each of plural optical elements adjoining each other can be equipped with such a driving system. This leads to enlargement of the degree of adjustment freedom of the whole optical system, and it contributes to improvements of the optical performance. Furthermore, since the apparatus mechanism as a whole can be made small in size, the installment area as well as the cost can be reduced conveniently.

Embodiment 5

In the first to fourth embodiments of the present invention described hereinbefore, a structural member for picking out an output displacement of the actuator and a linkage mechanism member for performing direction conversion to the displacement have a shape by which they can be made from a single base material. In a driving system according to a fifth embodiment of the present invention to be described below, these structural components are made separate for a further reduction in thickness of the structure.

FIGS. 13A and 13B through FIGS. 15A and 15B are illustrations concerning a driving system according to the fifth embodiment of the present invention.

Figure 13A:
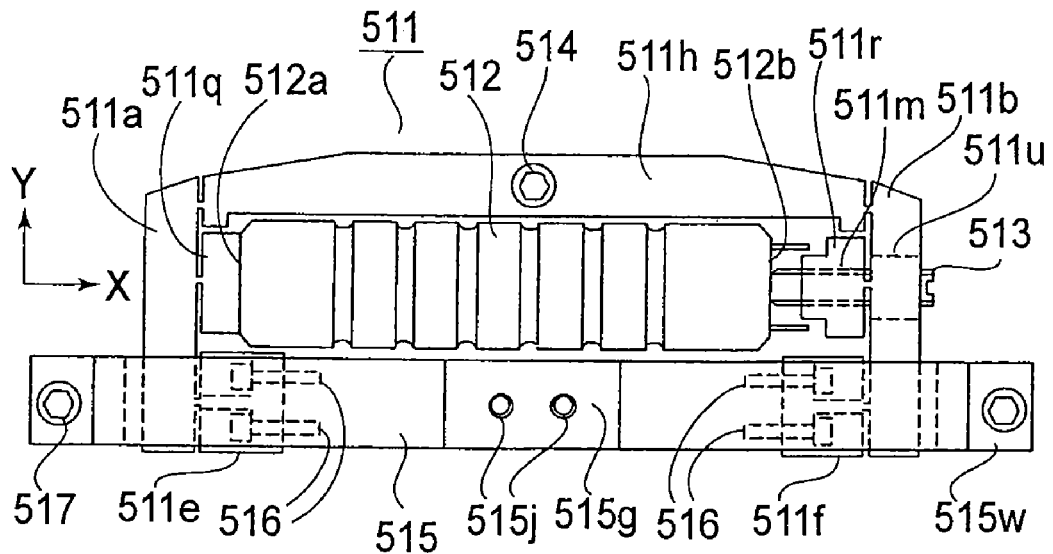
FIGS. 13A and 13B are schematic views, respectively, for explaining the structure of a driving system according to a fifth embodiment of the present invention.
Figure 13B:
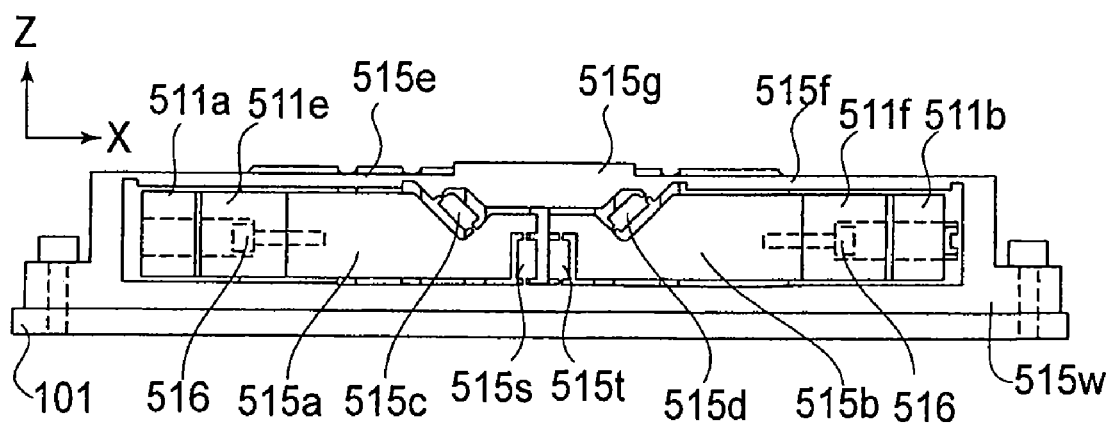

Specifically, FIGS. 13A and 13B illustrate details of the driving system of this embodiment, wherein FIG. 13A is a plan view of it as the same is seen from above along the optical axis direction of the lens, and FIG. 13B is a side view of the same as seen from the lens center. The X axis, Y axis and Z axis are defined as illustrated, similarly to the first embodiment.

In FIGS. 13A and 13B, the mechanism comprises a fixed barrel 101, a driving mechanism main assembly 511, a piezoelectric actuator 512 having piezoelectric output ends 512a and 512b, a piezoelectric actuator adjusting screw 513, a driving mechanism mount screws 514, a direction converting member 515, converting member connecting screws 516, and converting member mounting screws 517. The driving mechanism main assembly 511 includes displacement pick-out linkages 511a and 511b, coupling linkages 511e and 511f, a fixed linkage 511h, a piezoelectric actuator abutment 511k, an adjusting screw bore 511m, piezoelectric actuator end linkages 511q and 511r, and an adjusting screw clearance bore 511u.

The direction converting member 515 includes horizontal linkages 515a and 515b, direction converting linkages 515c and 515d, supporting linkages 515e and 515f, a lens frame driving linkage 515g, lens frame mounting screw bores 515j, supporting linkages 515s and 515t, and a bottom 515w.

The barrel 101 has a flat portion such as shown in FIGS. 3A-3C. The driving system main assembly 511 has a linkage mechanism having been made from a single metal block in accordance with a wire electric discharge machining process and a cutting process. The piezoelectric actuator 512 of a lamination type has a similar structure as that of the piezoelectric actuator 112 of the first embodiment, and it includes a driving source having alternately layered electrostrictive elements and electrodes, which driving source is sealingly housed in a closed type cylindrical container. The whole length of the piezoelectric actuator 512 with respect to the X-axis direction is expandable approximately in proportion to an applied voltage thereto. The piezoelectric actuator adjusting screw 513 is provided to correct any dimensional error of the actuator 512, and it is interposed between the driving system main assembly 511 and the actuator 512. The mount screws 514 serve to fixedly connect the driving system main assembly 511 to the barrel 101.

The direction converting member 515 functions to convert an output displacement, transmitted to the driving system main assembly 511 from the piezoelectric actuator 512, into a displacement in the Z direction.

The connecting screws 516 connect the coupling linkages 511e and 511f, which are displacement output portions of the driving system main assembly 511, to the horizontal linkages 511a and 511b, which are displacement input portions of the direction converting member 515.

The mounting screws 517 connect the direction converting member 515 to the lens barrel 101.

Figure 14A:
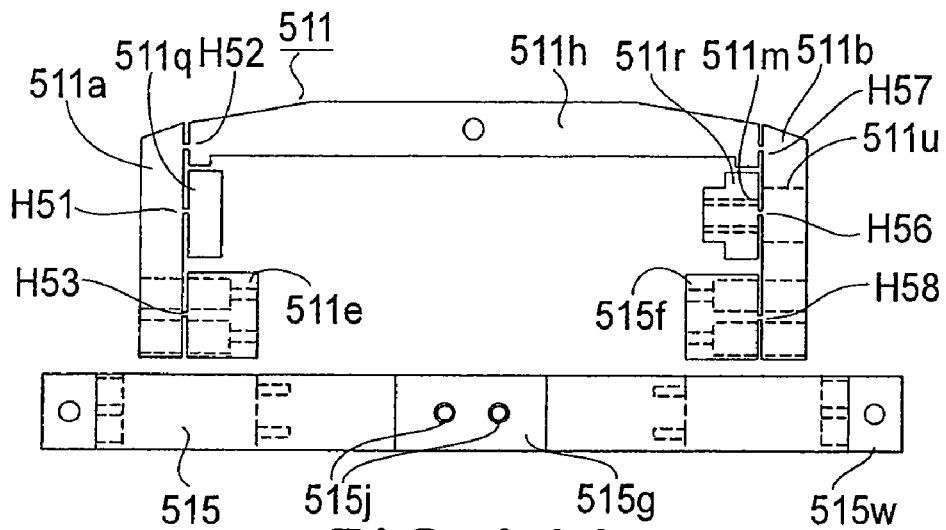
FIGS. 14A, 14B and 14C are schematic views, respectively, for explaining details of the structure of the driving system according to the fifth embodiment of the present invention.
Figure 14B:
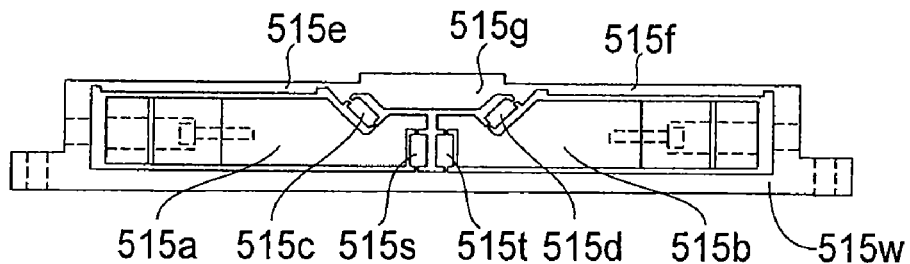
Figure 14C:
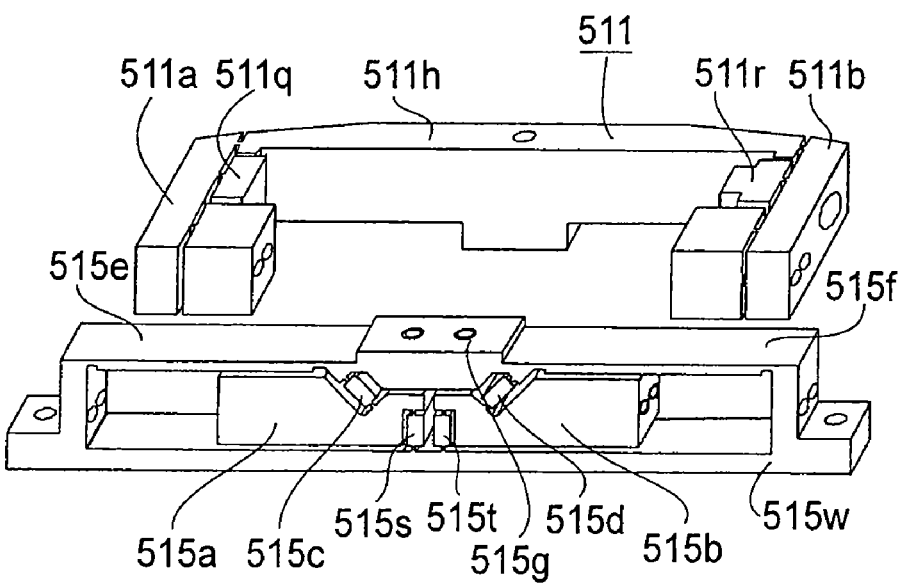

FIGS. 14A-14C show details of the linkage mechanism, wherein the piezoelectric actuator 512 and the piezoelectric actuator adjusting screw 513 are demounted from the driving system main assembly 511. Here, FIG. 14A is a plan view, FIG. 14B is a side view, and FIG. 14C is a perspective view.

Referring to FIGS. 14A-14C, the manner of how to make the driving system main assembly 511 and the direction converting member 515 will be explained below.

First of all, as regards the driving system main assembly 511, the outside configuration of the linkage mechanism, such as shown in FIG. 14A, is created from a base material, which is a plate-like metal block having a predetermined thickness, in accordance with a wire electrical discharge machining process.

Subsequently, by using a drilling machine, a bore for a central screw bore is formed and, thereafter, from the side faces of opposite arm portions, bores for mounting screw bores and a screw clearance bore are machined. Finally, the adjusting screw bore 511m for receiving the piezoelectric actuator adjusting screw 513 is threaded, by which the machining is completed.

As regards the direction converting member 515, on the other hand, the outside configuration and slits of the linkage mechanism, such as shown in FIG. 14B, are created from a base material, which is a plate-like metal block, in accordance with a wire electrical discharge machining process. Subsequently, by using a drilling machine, bores for lens frame mounting screw bores 515j shown at the middle of FIG. 14A are formed and, after that, from the opposite side faces, bores for the mounting screw bores and a screw clearance bore are machined. Finally, the lens frame mounting screw bores 515j and the bores of the horizontal linkages 515a and 515b are threaded, by which the machining is completed.

Referring to FIGS. 13A and 13B and FIGS. 14A-14C, the assembling procedure of the driving system of the fifth embodiment will be explained.

First of all, in the perspective view of FIG. 14C, the left-hand and right-hand arms of the driving system main assembly 511 are inserted into two windows of the direction converting member 515. Then, these arms are connected by means of the connecting screws 516, as shown in FIG. 13A. Subsequently, the piezoelectric actuator 512 is put into an inside central space of the driving system main assembly 511. After this, the piezoelectric actuator adjusting screw 513 is screwed into the piezoelectric actuator adjusting screw bore 511m from the right-hand side thereof, to push the bottom 512b of the piezoelectric actuator 512 leftwardly, until the output end 512a of the piezoelectric actuator 512 abuts against the right-hand end face of the piezoelectric actuator end linkage 511q of the linkage mechanism. Then, the mounting of piezoelectric actuator 512 is completed. Finally, by means of the mounting screws 514 and 517, the linkage mechanism is fixed to the barrel 101. Then, the assembling is completed.

Figure 15A:
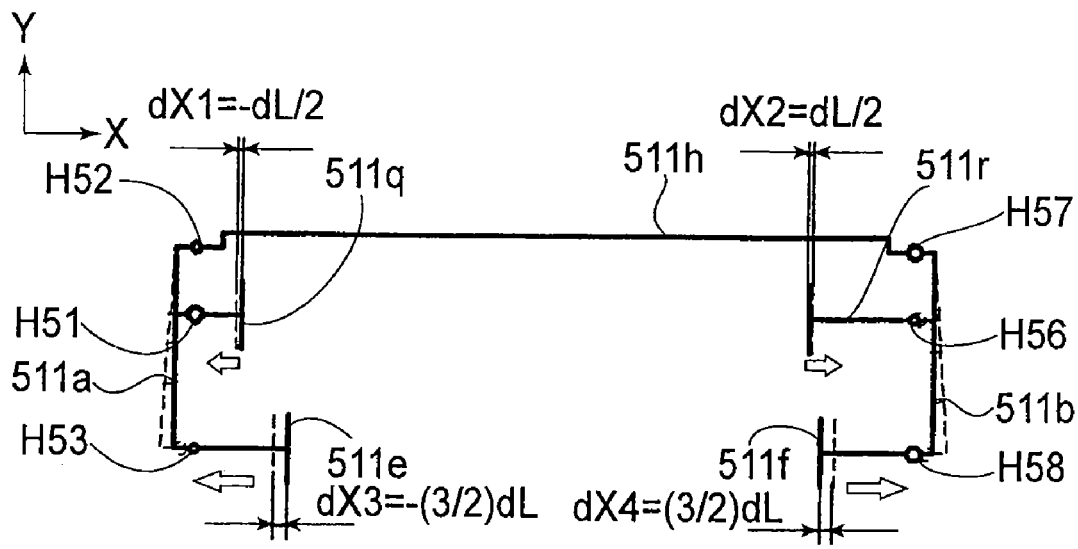
FIGS. 15A and 15B are schematic views, respectively, for explaining the operation of the driving system according to the fifth embodiment of the present invention.
Figure 15B:
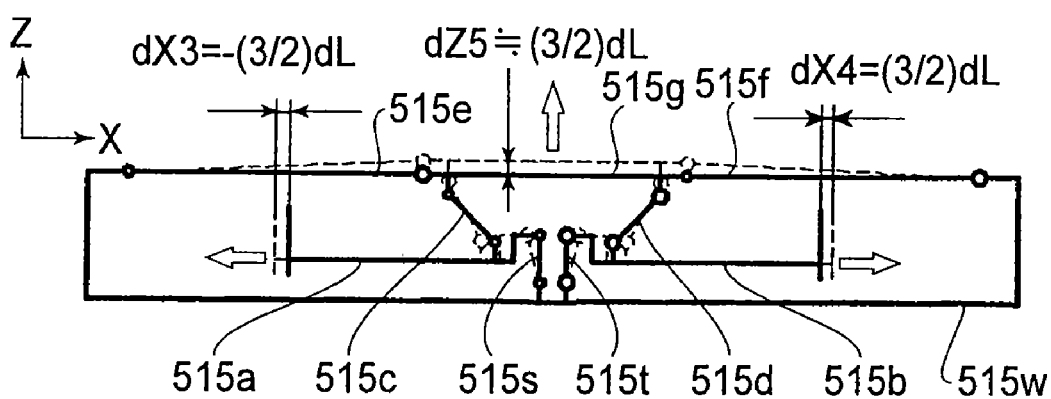

FIGS. 15A and 15B are illustrations for explaining the linkage operation of the driving system main assembly 511 and the direction converting member 515. Here, the driving system main assembly 511 is illustrated schematically on the basis of the plan view of FIG. 14A, while the direction converting member 515 is illustrated schematically on the basis of the side view of FIG. 14B.

Referring to FIGS. 13A and 13B and FIGS. 15A and 15B, the operational principle of the driving system according to the fifth embodiment will be explained.

If a predetermined voltage is applied to two electrode terminals, which are provided at the bottom of the right-hand side end portion of the piezoelectric actuator 512, in response, the whole length L of the piezoelectric actuator 512 expands by dL in the X-axis direction. As a result of this, as shown at the top of FIG. 15A, one (511q) of the piezoelectric actuator end linkages shifts leftwardly by dX1=−dL/2, while the other piezoelectric actuator end linkage 511r shifts rightwardly by dX2=dL/2. Here, the displacement pick-out linkages 511a and 511b, which are arranged to be pivotally rotatable about hinges H52 and H57, respectively, and which extend in the Y direction, are pivotally moved about the Z axis by a predetermined small angle. The coupling linkage 511e displaces by dX3, and the coupling linkage displaces by dX4.

The displacements of these coupling linkages 511e and 511f in the X-axis direction are transmitted to the horizontal linkages 515a and 515f of the direction converting member 515, respectively, as shown at the bottom of FIG. 15A.

The direction converting linkages 515c and 515d, which are disposed at an angle of about 45 degrees with respect to the X axis, are pivotally moved, by which the lens frame driving linkage 515g is moved upwardly in the Z-axis direction by dZ5.

Although the lens frame driving linkage 511g displaces in the Z direction in response to the extension of the piezoelectric actuator 512 as described above, it is preferable that the lens frame driving linkage 511g can displace only in the Z direction and it is not displaceable in the X and Y directions.

In order to accomplish such structural features, an auxiliary linkage to be described below may be added.

First of all, in order to restrict movement of the lens frame driving linkage 511g in the X direction, supporting linkages 511e and 511f are connected to the left-hand side and right-hand side of the lens frame driving linkage 511g.

By means of these supporting linkages, it is assured that the lens frame driving linkage 511g has a displacement freedom with respect to the Z direction, whereas the freedom in the X direction is restricted.

On the other hand, in order to restrict motion of the lens frame driving linkage 515g in the Y direction, other supporting linkages 515s and 515t are provided.

These supporting linkages 515s and 515t are provided in a region closer to the center of the horizontal linkages 515a and 515b. They function to restrict the freedom of the horizontal linkages in the Y direction, while keeping their freedom with respect to the X direction.

Hence, the Y-axis restriction effect of the horizontal linkages 515a and 515b is transmitted to the lens frame driving linkage 515g through the direction converting linkages 515c and 515c.

With the structure described above, it is assured that the region around the lens frame mounting screw bores 511j in the lens frame mounting linkage 515g is displaceable only in the Z direction, and the freedom thereof with respect to the X and Y directions is restricted. Therefore, the lens frame 104 can be driven in the Z direction very accurately.

Furthermore, the displacement magnifying ratio for the piezoelectric actuator 512 can be easily set at a desired quantity by appropriately setting the interspaces among the hinges H51, H52 and H53, and the interspaces among the hinges H56, H57 and H58.

The driving system 511 of the fifth embodiment may be replaced by the driving system 110 of FIGS. 3A-3C, and the control block diagram as well as the control sequence having been described with reference to FIGS. 6 and 7, may be used. On that occasion, similar functions as those of the first embodiment will be provided.

As described above, the driving system according to the fifth embodiment of the present invention may include (i) driving means for producing a drive displacement in the X direction, on the basis of a change in the whole length thereof or a motion of a displacement output portion thereof, (ii) displacement pick-out means extending in the Y direction, orthogonal to the X direction, to pick out the displacement, and (iii) direction converting means for converting the displacement picked out by the displacement pick-out means into a displacement in the Z direction, which is orthogonal to both of the X and Y directions. The direction converting means may be disposed in the Y direction, relative to the driving means. Additionally, the direction converting means may have an approximately symmetrical shape with respect to the X direction, and the displacement pick-out means may be pivotally movable about the Z axis. Furthermore, the displacement pick-out means and the direction converting means may be made from separate members and then coupled together thereafter.

In accordance with the fifth embodiment of the present invention described hereinbefore, the following advantageous results are obtainable.

5.1 Use of driving means, such as a laminated piezoelectric actuator extending in the X direction and a linkage mechanism provided in the Y direction orthogonal to the X direction and having a function for converting an output displacement of the actuator produced in the X direction into a displacement in the Z direction, which is orthogonal to the X and Y directions, enables provision of a small-thickness driving system with the size thereof in the Z direction being decreased.

5.2 Since the linkage mechanism has an approximately symmetrical shape with respect to the X direction, unwanted displacement in the X direction can be made quite small.

5.3 Linkage means for restricting the freedom with respect to the X direction is provided adjacent to the opposite sides of the final displacement output end. This assures minimization of unwanted displacement in the X direction and, in addition to this, the rigidity in that direction can be made quite large.

5.4 The design freedom with respect to the positions of three resilient hinges to be provided on the displacement pick-out linkage is very large and, therefore, the displacement magnifying ratio of the piezoelectric actuator can be easily set to a desired quantity.

5.5 The output displacement pick-out member of the actuator and the direction converting member for the picked out displacement are made as separate members. With this arrangement, the size of the linkage mechanism at its largest thickness portion can be made as small as say the height of the actuator. Hence, this embodiment provides a thin-type driving system with its Z-direction dimension being further reduced.

5.6 A plurality of driving systems are disposed around an optical element. This ensures accurate drive of the optical element in a desired direction while, on the other hand, it enables a reduction in size of the optical element driving system, as a whole, including an optical element and driving systems therefor, particularly, in the thickness with respect to the optical axis direction of the optical element. As a result of this, each of plural optical elements adjoining each other can be equipped with such a driving system. This leads to enlargement of the degree of adjustment freedom of the whole optical system, and it contributes to improvements of the optical performance. Furthermore, since the apparatus mechanism, as a whole, can be made small in size, the installment area, as well as the cost can be reduced conveniently.

Embodiment 6

In a driving system according to a sixth embodiment of the present invention to be described below, the third and fifth embodiments described above are combined together so as to provide a driving system in which the mechanical characteristics are improved further.

FIGS. 16A and 16B through FIGS. 18A and 18B are illustrations concerning the driving system according to the sixth embodiment of the present invention.

Figure 16A:
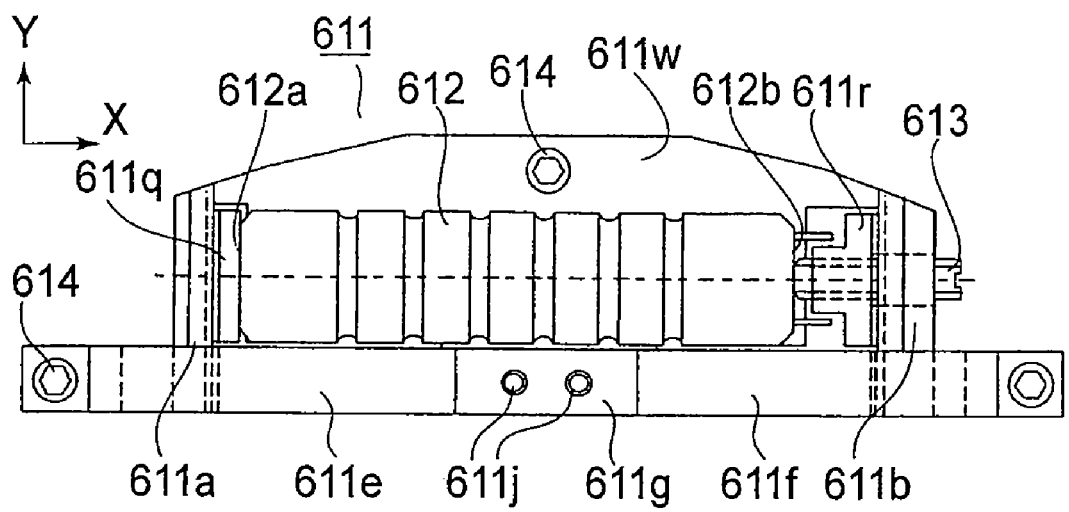
FIGS. 16A and 16B are schematic views, respectively, for explaining the structure of a driving system according to a sixth embodiment of the present invention.
Figure 16B:
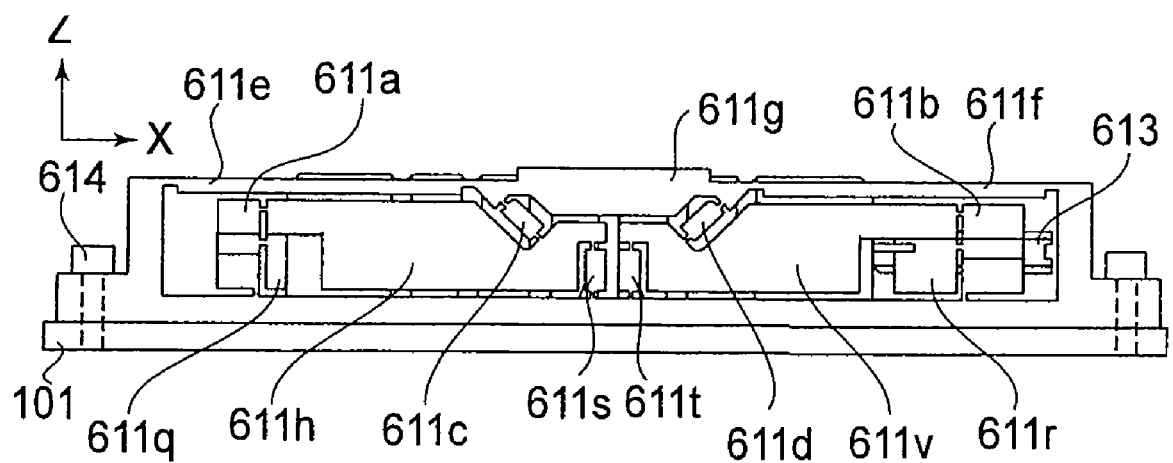

Specifically, FIGS. 16A and 16B illustrate details of the driving system of the sixth embodiment, wherein FIG. 16A is a plan view of it as the same is seen from above along the optical axis direction of the lens, and FIG. 16B is a side view of the same as seen from the lens center. The X axis, Y axis and Z axis are defined as illustrated, similarly to the first embodiment.

In FIGS. 16A and 16B, the mechanism comprises a fixed barrel 101, a driving mechanism main assembly 611, a piezoelectric actuator 612 having piezoelectric output ends 612a and 612b, a piezoelectric actuator adjusting screw 613, and driving mechanism mount screws 614. The driving mechanism main assembly 611 includes displacement pick-out linkages 611a and 611b, direction converting linkages 611c and 611d, supporting linkages 611e and 611f, a lens frame driving linkage 611g therefor, lens frame mount screw bores 611j, a piezoelectric actuator abutment linkage 611k, an adjusting screw bore 611m, bottom notches 611p, piezoelectric actuator end linkages 611q and 611r, supporting linkages 611s and 611t, an adjusting screw clearance bore 611u, horizontal linkages 611h and 611v, and a bottom 611w.

The barrel 101 has a flat portion. The driving system main assembly 611 has a linkage mechanism having been made from a single metal block in accordance with a wire electrical discharge machining process and a cutting process.

The piezoelectric actuator 612 of a lamination type has a similar structure as that of the piezoelectric actuator 112 of the first embodiment, and it includes a driving source having alternately layered electrostrictive elements and electrodes, which driving source is sealingly housed in a closed type cylindrical container. The whole length of the piezoelectric actuator 612 with respect to the X-axis direction is expandable approximately in proportion to an applied voltage thereto. The piezoelectric actuator adjusting screw 613 is provided to correct any dimensional error of the actuator 612, and it is interposed between the driving system main assembly 611 and the actuator 612. The mount screws 614 are screwed into the fixed barrel, from the top surface side of the driving system main assembly 611.

Figure 17A:
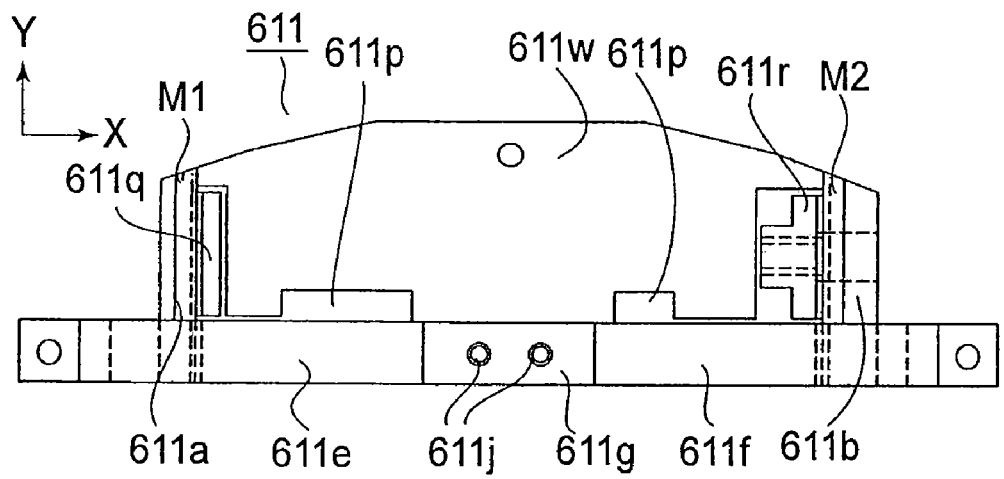
FIGS. 17A, 17B and 17C are schematic views, respectively, for explaining details of the structure of the driving system according to the sixth embodiment of the present invention.
Figure 17B:
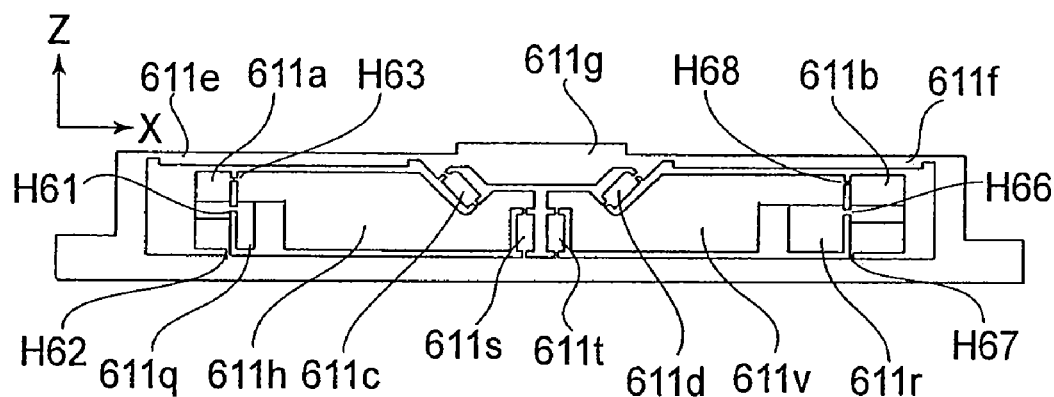
Figure 17C:
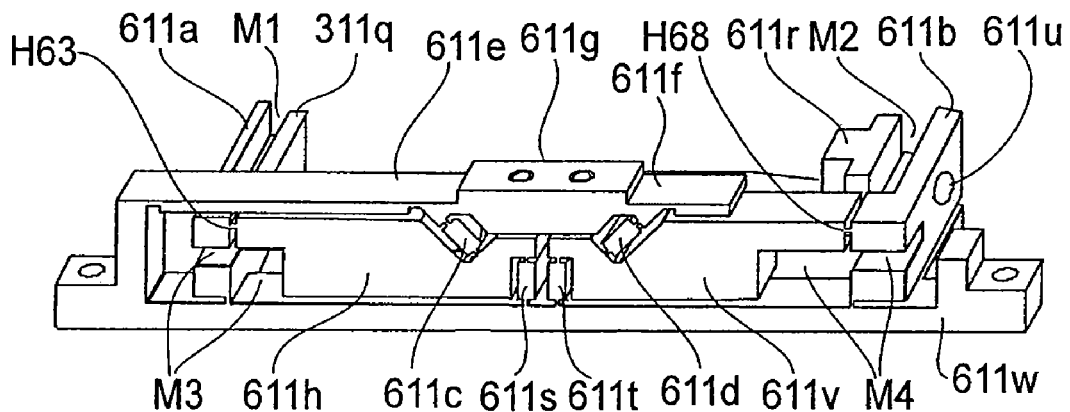

FIGS. 17A-17C show details of the linkage mechanism wherein the piezoelectric actuator 612 and the piezoelectric actuator adjusting screw 613 are demounted from the driving system main assembly 611. Here, FIG. 17A is a plan view, FIG. 17B is a side view and FIG. 17C is a perspective view.

Referring to FIGS. 17A-17C, the manner of how to make the driving system main assembly 611 will be explained below.

First of all, from a metal block, which is a base material, by milling, the outermost configuration surface of the linkage mechanism is produced. Furthermore, by milling, the surface of the bottom 611w of the mechanism shown in FIG. 17A is formed. Subsequently, the portions at two locations M1 and M2 on the top surface, shown in FIG. 17C, are removed by milling, whereby grooves M1 and M2 are formed. This milling process is carried out so as to avoid that resilient hinges H63 and H68, which are going to be produced later by a wire electrical discharge machining process (to be described later) are created at incorrect positions. After this, in order to remove corner portions of the bottom plate 611w, bottom notches 611p are formed by a wire electrical discharge machining process.

Subsequently, by wire electrical discharge machining, a slit shown in the side view of FIG. 17B is formed. By forming this slit, the linkage structure is produced. More specifically, linkage structure components depicted at 611a, 611b, 611c, 611d, 611e, 611f, 611g, 611h, 611i, 611j, 611k, 611l, 611m, 611n, 611o, 611p, 611q, 611r, 611s, 611t, 611u, 611v, 611w, 611x, and 611y, as well as resilient hinges for connecting these linkages, are formed. After this, by milling, portions at locations M3 and M4 shown in FIG. 17C are removed, whereby counterbores M3 and M4 are defined. This milling process is carried out to remove unnecessary portions of resilient hinges H61 and H66 having been produced by the preceding wire electrical discharge machining process.

Finally, by using a drilling machine, bores for lens frame mounting screw bores 611j, piezoelectric actuator adjusting screw bore 611m, and three bores for connection with the fixed barrel are machined and then they are threaded. By this, the linkage mechanism is accomplished. With the procedure described above, the linkage mechanism of the driving system main assembly 611 can be produced out of a single metal block.

Referring now to FIGS. 16A and 16B, the assembling procedure of the driving system according to the sixth embodiment will be explained.

First of all, the piezoelectric actuator 612 is put into an inside central space of the driving system main assembly 611. After this, the piezoelectric actuator adjusting screw 613 is screwed into the piezoelectric actuator adjusting screw bore 611m from the right-hand side thereof, to push the bottom 612b of the piezoelectric actuator 612 leftwardly, until the output end 612a of the piezoelectric actuator 612 abuts against the right-hand end face of the piezoelectric actuator end linkage 611q of the linkage mechanism. Then, the mounting of piezoelectric actuator 612 is completed.

Subsequently, by means of the mounting screws 614, the driving system main assembly 611 is fixed to the barrel 101. Then, the assembling is completed.

Figure 18A:
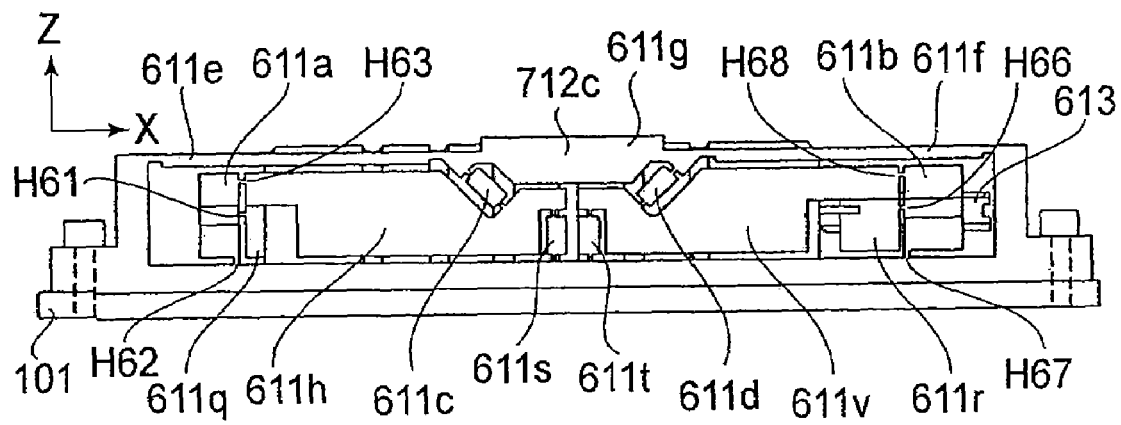
FIGS. 18A and 18B are schematic views, respectively, for explaining the operation of the driving system according to the sixth embodiment of the present invention.
Figure 18B:
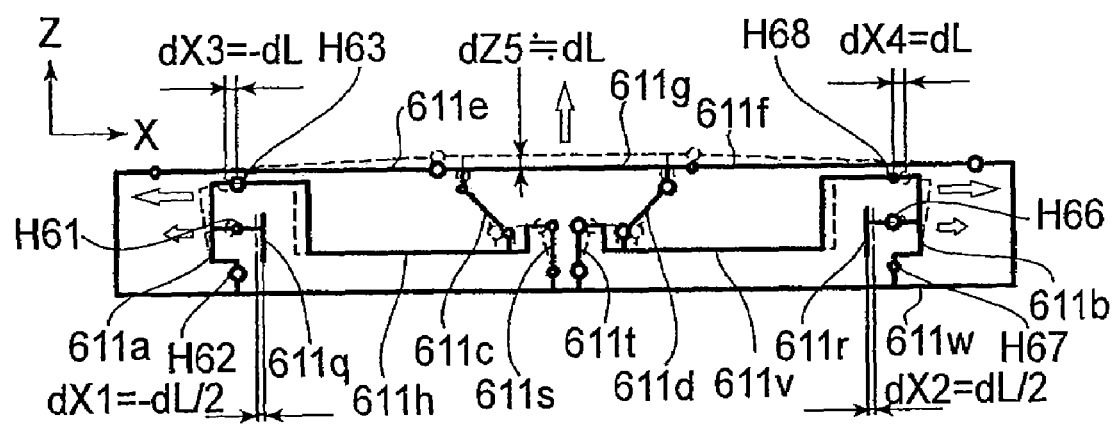

FIGS. 18A and 18B are illustrations for explaining the linkage operation of the driving system main assembly 611, wherein FIG. 18A is a side view corresponding to FIG. 16B, and FIG. 18B is a schematic illustration of the same.

Referring to FIGS. 16A, 16B, 17A, 17B, 17C, 18A and 18B, the operational principle of the driving system according to the sixth embodiment of the present invention will be explained.

First of all, if a predetermined voltage is applied to two electrode terminals which are provided at the bottom of the right-hand side end portion of the piezoelectric actuator 612, in response, the whole length L of the piezoelectric actuator 612 expands by dL in the X-axis direction. Then, one (611q) of the piezoelectric actuator end linkages shifts leftwardly by dX1=–dL/2, while the other piezoelectric actuator end linkage 611r shifts rightwardly by dX2=dL/2. The displacements of these linkages are transmitted to the displacement pick-out linkages 611a and 611b extending in the Y direction, through hinges H61 and H66.

Here, since the displacement pick-out linkages 611a and 611b are arranged to be pivotally rotatable about hinges H62 and H67, respectively, the displacement pick-out linkages 611a and 611b are pivotally moved about the Y axis by a predetermined small angle. As a result of this, the upper end of the displacement pick-out linkage 611a displaces in the X direction by about dX3=–dL, while the upper end of the linkage 611b displaces in the X direction by about dX3=dL. Here, these displacement pick-out linkages 611a and 611b are connected to horizontal linkages 611h and 611y extending in the X direction, through hinges H63 and H68, respectively. Therefore, the horizontal linkage 611h displaces in the X direction by about dX3=–dL, while the horizontal linkage 611y displaces in the X direction by about dX3=dL. Hence, the direction converting linkages 611c and 611d, which are disposed at an angle of about 45 degrees with respect to the X axis, are pivotally moved, such that the lens frame driving linkage 611g is moved upwardly in the Z direction by an amount dZ5≈dL.

Although the lens frame driving linkage 611g displaces in the Z direction in response to the extension of the piezoelectric actuator 612, as described above, it is preferable that the lens frame driving linkage 611g can displace only in the Z direction, and it is not displaceable in the X and Y directions.

In order to accomplish such structural features, an auxiliary linkage to be described below may be added.

First of all, in order to restrict movement of the lens frame driving linkage 611g in the X direction, supporting linkages 611e and 611f are connected to the left-hand side and right-hand side of the lens frame driving linkage 611g. By means of these supporting linkages 611e and 611f, it is assured that the lens frame driving linkage 611g has a displacement freedom with respect to the Z direction, whereas the freedom in the X direction is strictly restricted.

On the other hand, in order to restrict motion of the lens frame driving linkage 611g in the y direction, other supporting linkages 611s and 611t are provided. These supporting linkages 611s and 611t are provided in a region closer to the center of the horizontal linkages 611h and 611y. They function to restrict the freedom of the horizontal linkages in the Y direction, while keeping their freedom with respect to the X direction. Hence, the Y-axis restriction effect of the horizontal linkages 611h and 611y is transmitted to the lens frame driving linkage 611g through the direction converting linkages 611c and 611d.

Next, the shape of the hinge H61 or H63 will be supplemented. The hinge H63 is formed by wire electrical discharge machining, as shown in the side view of FIG. 18A. Since it should connect only the displacement pick-out linkage 611a and the horizontal linkage 611h, the size thereof in the depth direction has to be confined within the range corresponding to the Y-direction size of the supporting linkage 611a, shown in the plan view of FIG. 17A.

Hence, as described hereinbefore, the groove portion M1 shown in FIG. 17A is removed by milling beforehand. It is assured with this procedure that the hinge H63 can be formed only at the connection between the displacement pick-out linkage 611a and the horizontal linkage 611h.

On the other hand, the hinge H61, as well, is formed by wire electrical discharge machining, as shown in the side view of FIG. 18A. Since the hinge H61 should connect only the displacement pick-out linkage 611a and the piezoelectric actuator end linkage 611q, the size thereof in the depth direction has to be confined within the range corresponding to the Y-direction size of the piezoelectric actuator end linkage 611q shown in the plan view of FIG. 17A.

Hence, as described hereinbefore, the groove portion M3 shown in FIG. 17C is removed by milling beforehand. It is assured with this procedure that the hinge H61 can be formed only at the connection between the displacement pick-out linkage 611a and the piezoelectric actuator end linkage 611q.

As regards the hinge H62, which provides a pivot center of the displacement pick-out linkage 611a extending in the Y direction, since it is made by machining based on wire electrical discharge machining and without removal by milling, in the Y-axis direction in FIG. 17A, it is formed continuously from the top end to the bottom end of the driving system main assembly 611.

Hence, the displacement pick-out linkage 611a is movable only pivotally about the Y axis, such that it provides a very high rigidity with respect to torsion about the X and Z axes. Resilient hinges H66 and H68, disposed at positions symmetrical with the resilient hinges H61 and H63, may be formed with a similar procedure.

With the structure described above, it is assured that the region around the screw bores 611j in the lens frame mounting linkage 611g is displaceable only in the Z direction, and the freedom thereof with respect to the X and Y directions is restricted. Therefore, the lens frame (not shown) can be driven in the Z direction very accurately.

The driving system 611 of the sixth embodiment may be replaced by the driving system 110 of FIGS. 3A-3C, and the control block diagram, as well as the control sequence having been described with reference to FIGS. 6 and 7, may be used. On that occasion, similar functions as those of the first embodiment will be provided.

As described above, the driving system according to the sixth embodiment of the present invention may include (i) driving means for producing a drive displacement in the X direction, on the basis of a change in the whole length thereof or a motion of a displacement output portion thereof, (ii) displacement pick-out means extending in the Y direction, orthogonal to the X direction, to pick out the displacement, and (iii) direction converting means for converting the displacement picked out by the displacement pick-out means into a displacement in the Z direction, which is orthogonal to both of the X and Y directions. The direction converting means may be disposed in the Y direction, relative to the driving means. Additionally, the direction converting means may have an approximately symmetrical shape with respect to the X direction, and the displacement pick-out means may be pivotally movable about the Y axis. Furthermore, the displacement pick-out means and the direction converting means may be made substantially from a single piece of material.

In accordance with the sixth embodiment of the present invention described hereinbefore, the following advantageous results are obtainable.

6.1 Use of driving means, such as a laminated piezoelectric actuator extending in the X direction and a linkage mechanism provided in the Y direction orthogonal to the X direction and having a function for converting an output displacement of the actuator produced in the X direction into a displacement in the Z direction, which is orthogonal to the X and Y directions, enables provision of a small-thickness driving system with the size thereof in the Z direction being decreased.

6.2 Since the linkage mechanism has an approximately symmetrical shape with respect to the X direction, unwanted displacement in the X direction can be made quite small.

6.3 A counter linkage for preventing unwanted displacement is omitted and, thus, further reduction in size is possible. Furthermore, since there is no load resistance of the counter linkage, a drive displacement of an equal amount is obtainable even by use of a lower-output actuator.

6.4 The design freedom with respect to the positions of three resilient hinges to be provided on the displacement pick-out linkage is very large and, therefore, the displacement magnifying ratio of the piezoelectric actuator can be easily set to a desired quantity.

6.5 Since the linkage mechanism having a rigid linkage and a resilient hinge can be made from a single block-like base material, any decrease of dimensional precision and a decrease of rigidity due to the coupling of plural components can be avoided. Furthermore, the assembling operation becomes easier, and, in addition to this, it is very convenient in regard to a reduction in size.

6.6 A plurality of driving systems are disposed around an optical element. This ensures accurate drive of the optical element in a desired direction while, on the other hand, it enables a reduction in size of the optical element driving system, as a whole, including an optical element and driving systems therefor, particularly, in the thickness with respect to the optical axis direction of the optical element. As a result of this, each of plural optical elements adjoining each other can be equipped with such a driving system. This leads to enlargement of the degree of adjustment freedom of the whole optical system, and it contributes to improvements of the optical performance. Furthermore, since the apparatus mechanism, as a whole, can be made small in size, the installment area, as well as the cost can be reduced conveniently.

6.7 Since a linkage member for restricting X-axis displacement is provided near the final displacement output portion, the rigidity of that final displacement output portion with respect to the X direction is improved and, in addition to it, unwanted displacement can be reduced much more.

Further Embodiment

Although the foregoing embodiments of the present invention have been described with reference to examples wherein a lamination type piezoelectric actuator having a variable length is used as a driving means, any other driving means may be used.

Figure 19A:
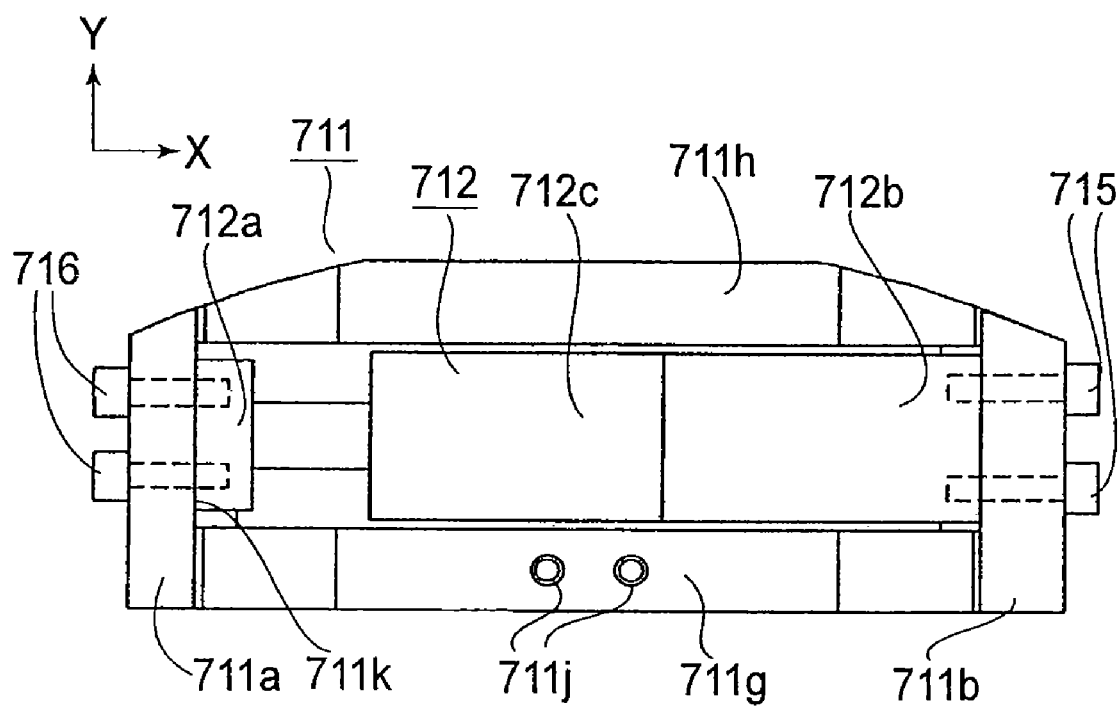
FIGS. 19A and 19B are schematic views, respectively, for explaining the structure of a modified example of a driving system according to the present invention.
Figure 19B:
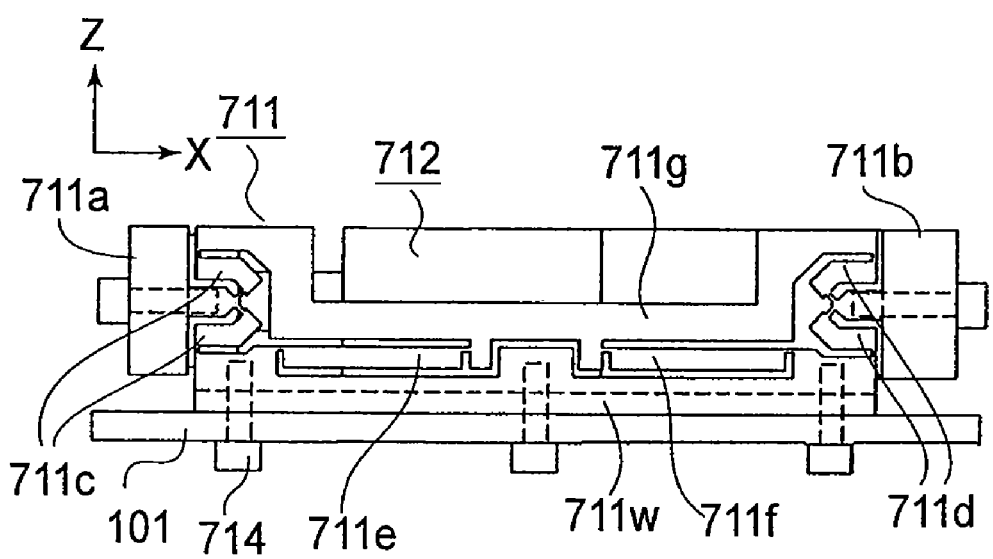

An example is shown in FIGS. 19A and 19B, wherein a precision straight-motion mechanism having a combination of a motor and a ball screw is incorporated into the linkage mechanism of the first embodiment.

In the plan view of FIG. 19A, the driving system main assembly 711 has a structure similar to that of the driving system main assembly 111 of the first embodiment.

In FIGS. 19A and 19B, the mechanism comprises a fixed barrel 101, a driving mechanism main assembly 711, a straight-motion mechanism 712 having displacement output means 712a, a motor main assembly 712b and straight motion converting means 712c, as well as mount screws 714, 715 and 716. The driving mechanism main assembly 711 includes displacement pick-out linkages 711a and 711b, direction converting linkages 711c and 711d, supporting linkages 711e and 711f, a lens frame driving linkage 711g, a counter linkage 711h, lens frame mount screw bores 711j, a straight-motion mechanism abutment 711k, bottom notches 711p, and a bottom 711w.

The driving system comprises a motor main assembly 712a, which includes a straight-motion actuator 712, a stepping motor or an ultrasonic motor, for example. The straight-motion converting means 712c comprises a combination of a linear guide and a ball screw. The displacement output means 712a is arranged to perform translational motion in the X-axis direction. The motor main assembly 712b is connected to the displacement pick-out linkage 711b by means of screws 715. The displacement output means 711a is fixed to the displacement pick-out linkage 711a by means of screws 716.

The structure of the remaining portion of this embodiment is similar to that of the first embodiment.

The straight-motion actuator 712 of this embodiment may, as a matter of course, be applied to the second, third, fourth, fifth and sixth embodiments of the present invention.

The direction converting linkage in the first, second, third, fourth, fifth and sixth embodiments of the present invention is arranged so that the angle defined between the X axis and a line that connects the hinges at the opposite ends is approximately equal to 45 degrees. However, while taking into account the output displacement characteristics of the actuator, as well as the maximum quantity of drive displacement to be required for the optical element, the linkage angle may be set to be appropriately within the range from about 20 degrees to about 70 degrees.

While the invention has been described with reference to the structures disclosed herein, it is not confined to the details set forth and this application is intended to cover such modifications or changes as may come within the purposes of the improvements or the scope of the following claims.

What is claimed is:

1. A driving system for driving an optical element, said system comprising:
a plurality of linear actuators, each having an output member and being displaceable in a tangential direction of the optical element;
a plurality of displacement picking units being elongated in a radial direction of the optical element to pick out a displacement of a respective output member in a direction away from the linear actuator with respect to the radial direction; and
a plurality of direction converting units configured to convert the displacement picked out by said displacement picking units into a displacement in an optical axis direction of the optical element, to displace the optical element in the optical axis direction.

2. A driving system according to claim 1, wherein said direction converting units have a shape approximately symmetrical with respect to a single plane, which is parallel to both of the radial direction and the optical axis direction of the optical element.

3. A driving system according to claim 1, wherein said displacement picking units are connected to opposite ends of said linear actuators with respect to the tangential direction of the optical element.

4. A driving system according to claim 1, wherein said displacement picking units are movable in the tangential direction and the optical axis direction of the optical element, and wherein movement of said displacement picking units in rotational directions about the tangential direction, radial direction and optical axis direction of the optical element, respectively, is restricted.

5. A driving system according to claim 1, further comprising an additional unit having approximately the same shape as that of said direction converting units, wherein said direction converting units and said additional unit are disposed at opposite sides of said linear actuators with respect to the radial direction of the optical element.

6. A driving system according to claim 1, wherein said displacement picking units and said direction converting units are made integrally from a single metal block.

7. A driving system according to claim 1, further comprising a support unit coupled to said direction converting units and configured to avoid motion of the optical element in the radial direction and the optical axis direction of the optical element.

8. A driving system according to claim 1, wherein said displacement picking units and said direction converting units are provided by separate members, and wherein said displacement picking units are connected to said direction converting units so as not to overlap the direction converting units with respect to the tangential direction of the optical element.

9. A driving system according to claim 1, wherein said linear actuators, said displacement picking units and said direction converting units are disposed on the same plane perpendicular to the optical axis direction of the optical element.

10. An exposure apparatus comprising:
    (a) a projection optical unit configured to project a pattern onto a substrate; and
    (b) a driving system configured to drive an optical element, which constitutes at least a part of said projection optical unit, said driving unit comprising:
        (i) a plurality of linear actuators, each having an output member and being displaceable in a tangential direction of the optical element;
        (ii) a plurality of displacement picking units being elongated in a radial direction of the optical element to pick out a displacement of a respective output member in a direction away from the linear actuators with respect to the radial direction; and
        (iii) a plurality of direction converting units configured to convert the displacement picked out by said displacement picking units into a displacement in an optical axis direction of the optical element to displace the optical element in the optical axis direction.

11. A device manufacturing method, comprising the steps of:
    exposing a substrate to a pattern by use of an exposure apparatus as recited in claim 10; and
    developing the exposed substrate.

12. A driving system for driving an optical element, said system comprising:
    a plurality of linear actuators, each having an output member configured to be displaceable in a tangential direction of the optical element;
    a plurality of displacement picking units being elongated in a radial direction of the optical element to pick out a displacement of a respective output member in a direction toward a center of the optical element; and
    a plurality of direction converting units configured to convert the displacement picked out by said displacement picking units into a displacement in an optical axis direction of the optical element, to displace the optical element in the optical axis direction.

\* \* \* \* \*